US008040718B2

United States Patent
Ueda

(10) Patent No.: US 8,040,718 B2
(45) Date of Patent: Oct. 18, 2011

(54) SEMICONDUCTOR MEMORY DEVICE

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 12/559,311

(22) Filed: Sep. 14, 2009

(65) Prior Publication Data

US 2010/0073992 A1 Mar. 25, 2010

(30) Foreign Application Priority Data

Sep. 25, 2008 (JP) .................. 2008-245965

(51) Int. Cl.
*G11C 11/00* (2006.01)

(52) U.S. Cl. ....................... 365/158; 365/148

(58) Field of Classification Search .................. 365/158, 365/148, 171

See application file for complete search history.

(56) References Cited

U.S. PATENT DOCUMENTS

| | | | |
|---|---|---|---|
| 6,385,109 B1 * | 5/2002 | Naji | 365/189.15 |
| 7,852,665 B2 * | 12/2010 | Chen et al. | 365/158 |
| 2006/0227598 A1 * | 10/2006 | Sakimura et al. | 365/158 |
| 2009/0010045 A1 | 1/2009 | Ueda | |

* cited by examiner

*Primary Examiner* — Anh Phung

(74) *Attorney, Agent, or Firm* — Knobbe, Martens, Olson & Bear, LLP

(57) ABSTRACT

A semiconductor memory device includes a memory cell having a first resistance state and a second resistance state, a bit line connected to the memory cell, a reference cell fixed to the first resistance state, a reference bit line connected to the reference cell, and a generation circuit configured to generate a reading voltage and a reference voltage. The generation circuit includes a constant current source connected to a first node, a first replica cell connected between the first node and a second node and fixed to the first resistance state, a second replica cell connected between the second node and a third node and fixed to the second resistance state, a first resistance element connected between the first node and a fourth node, and a second resistance element connected between the fourth node and the third node.

20 Claims, 15 Drawing Sheets

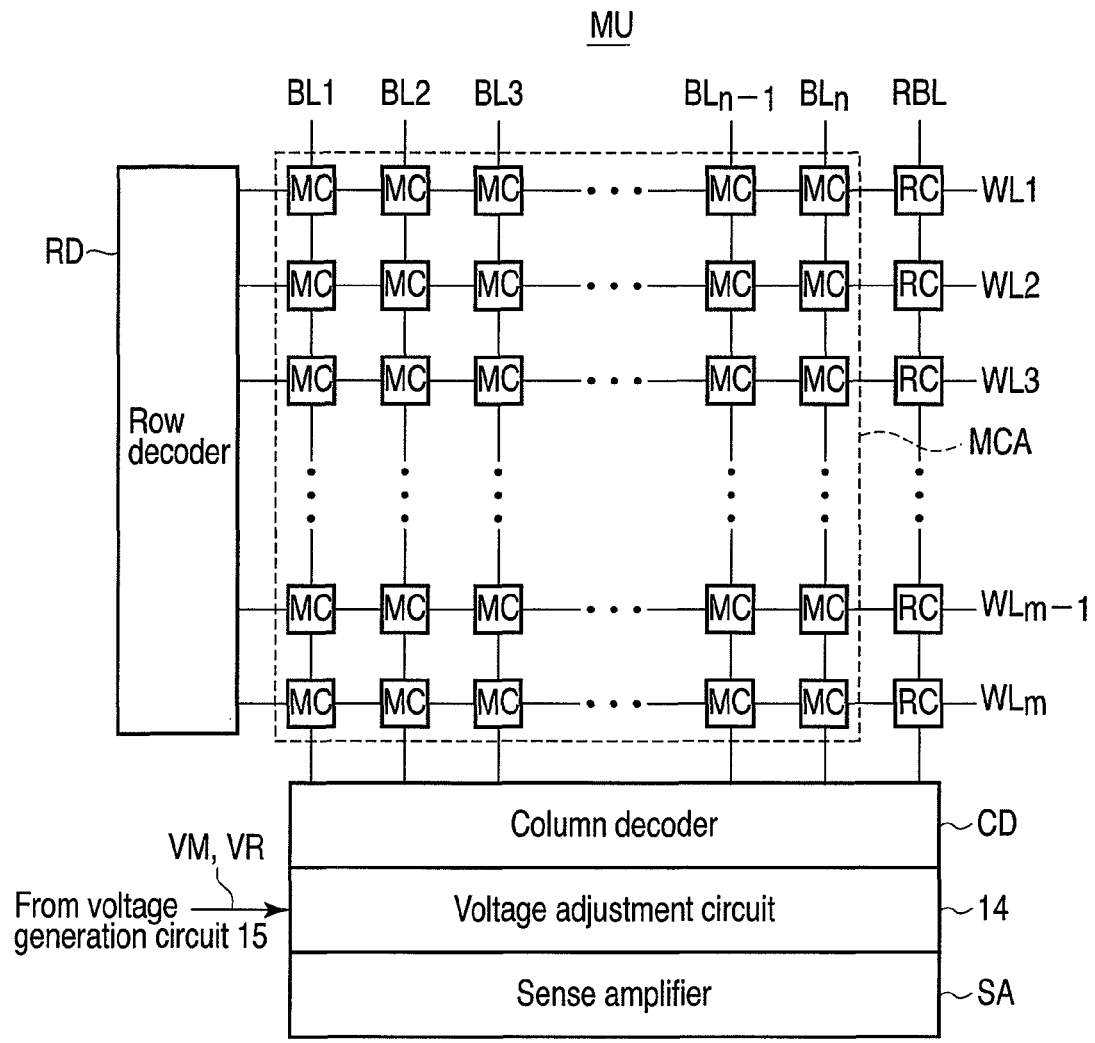
F I G. 2
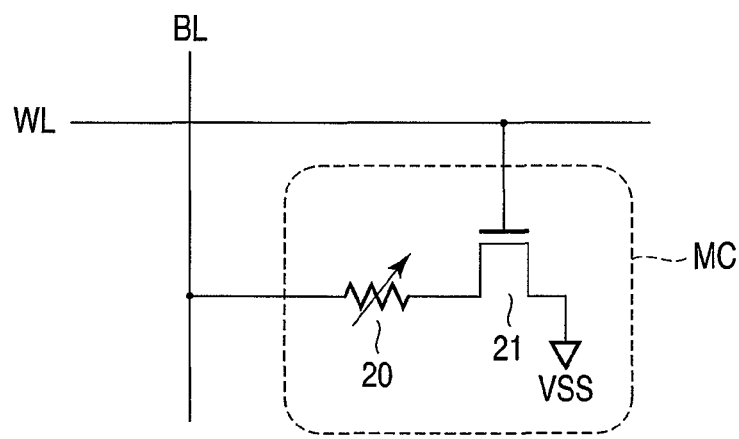
F I G. 3

Parallel state (low-resistance)  Antiparallel state (high-resistance)

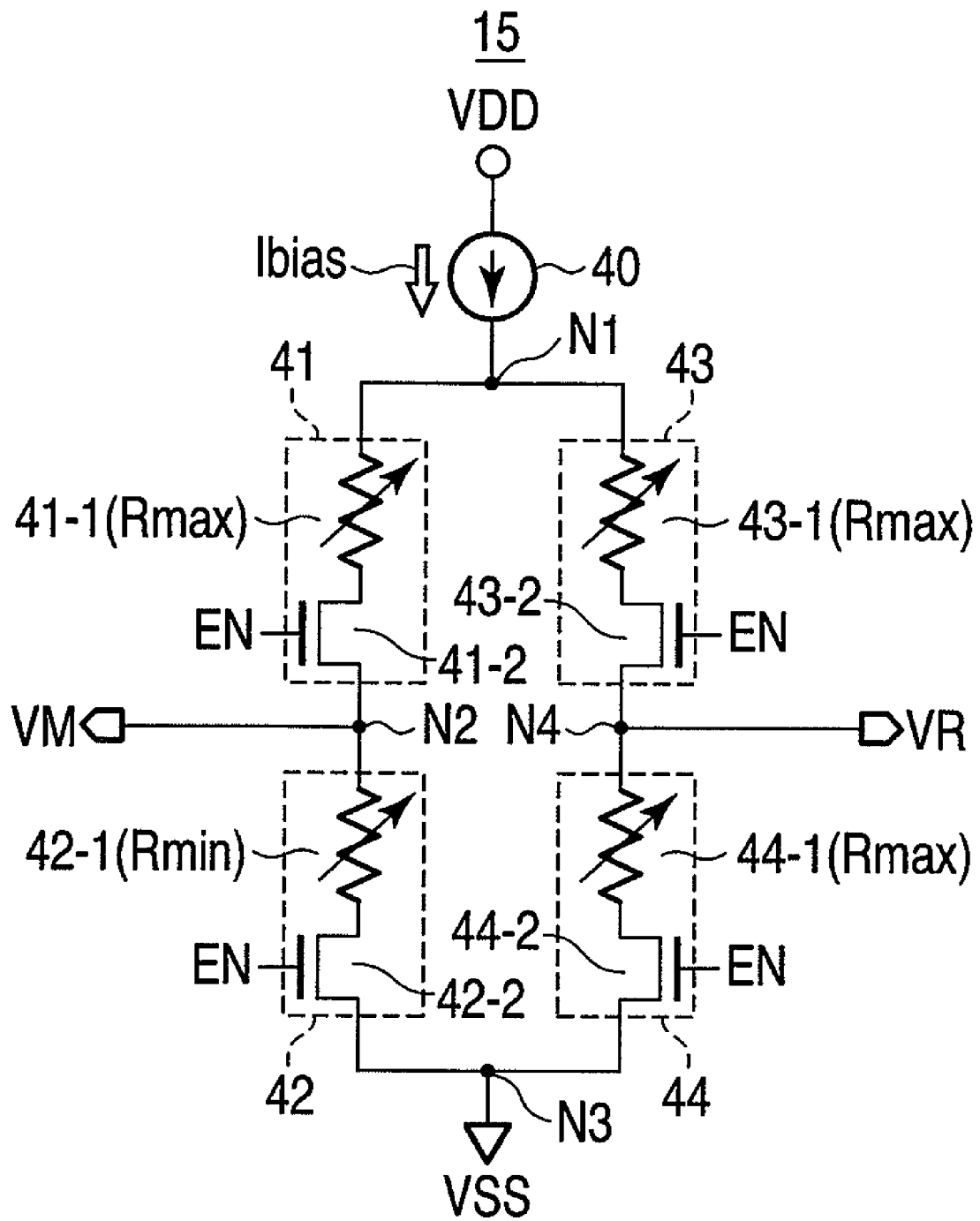
F I G. 10

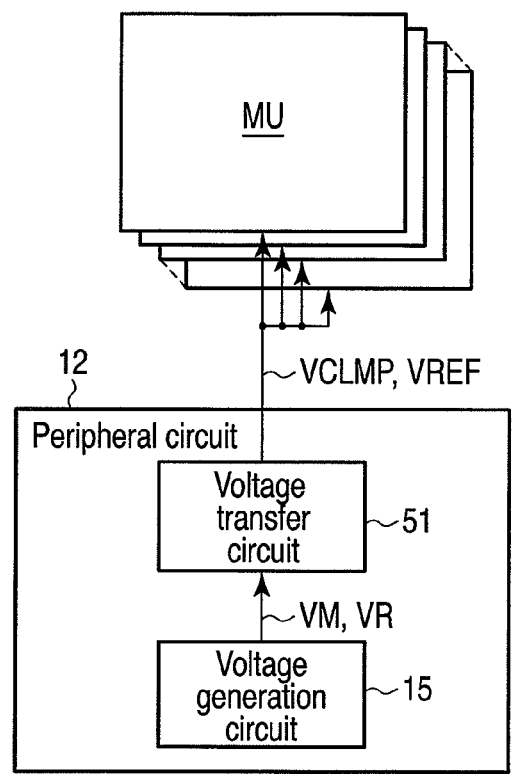
F I G. 12
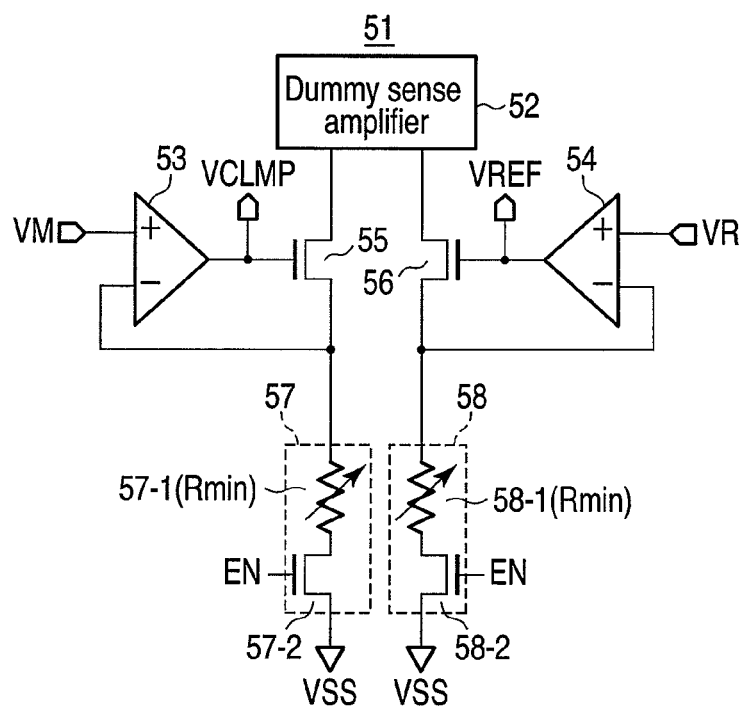
F I G. 13

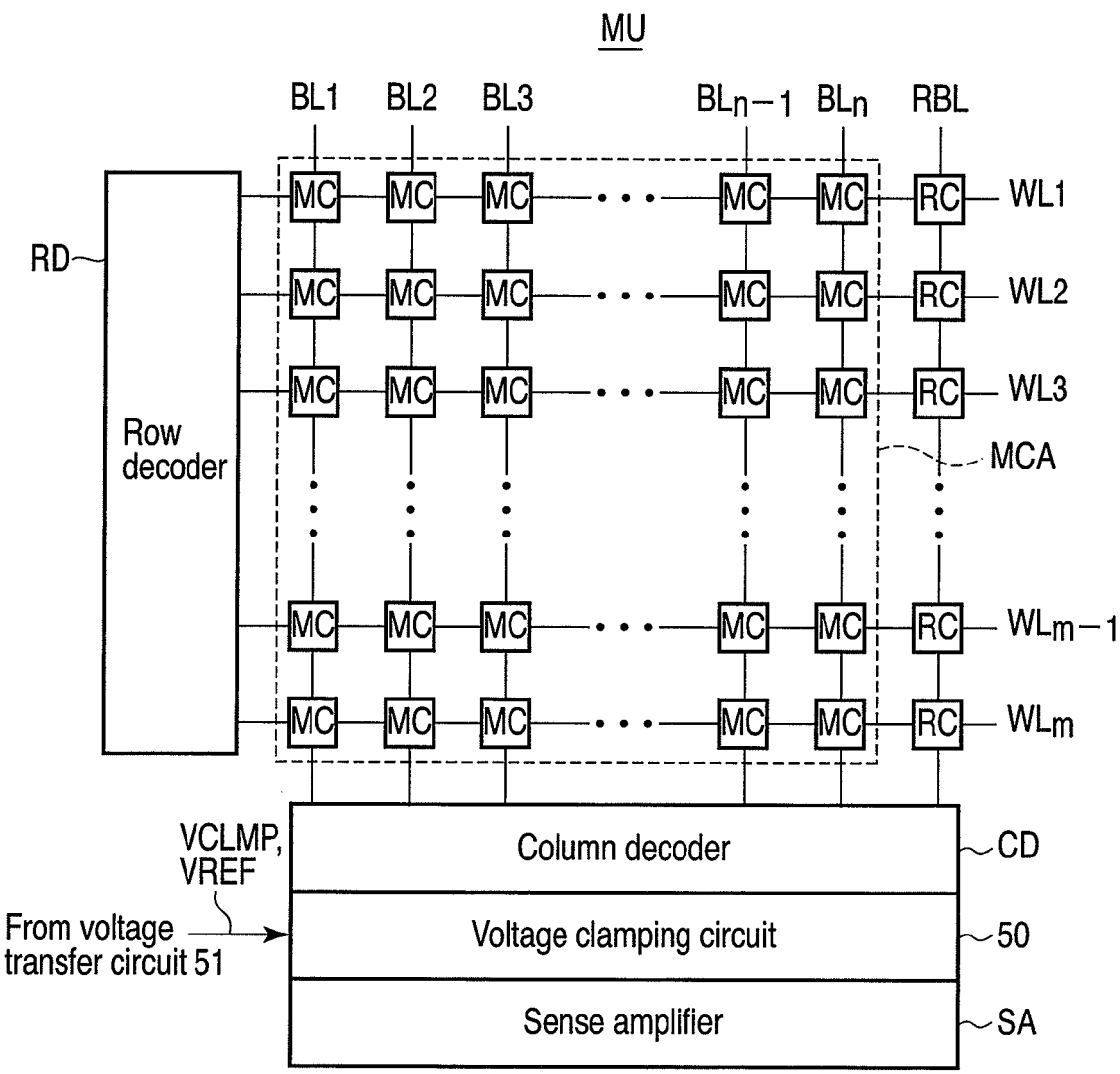
F I G. 14

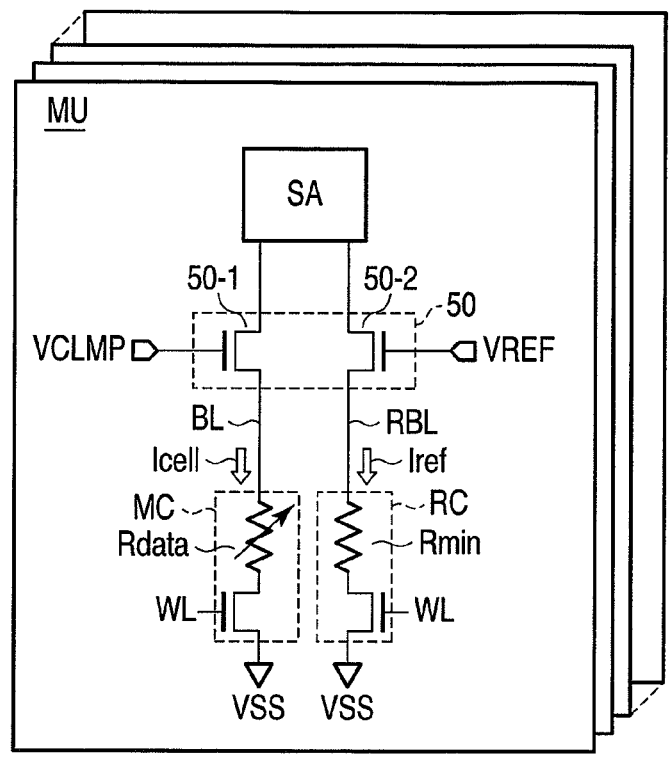
F I G. 15
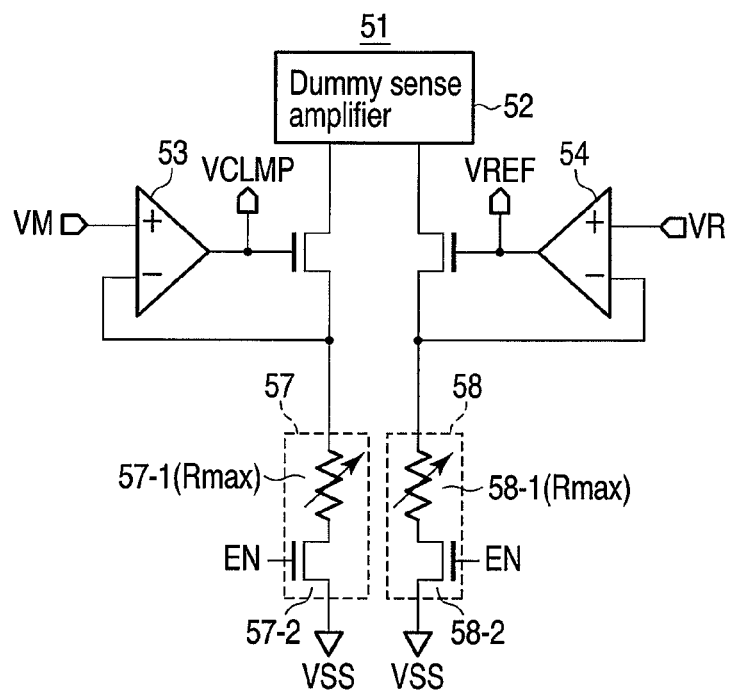
F I G. 16

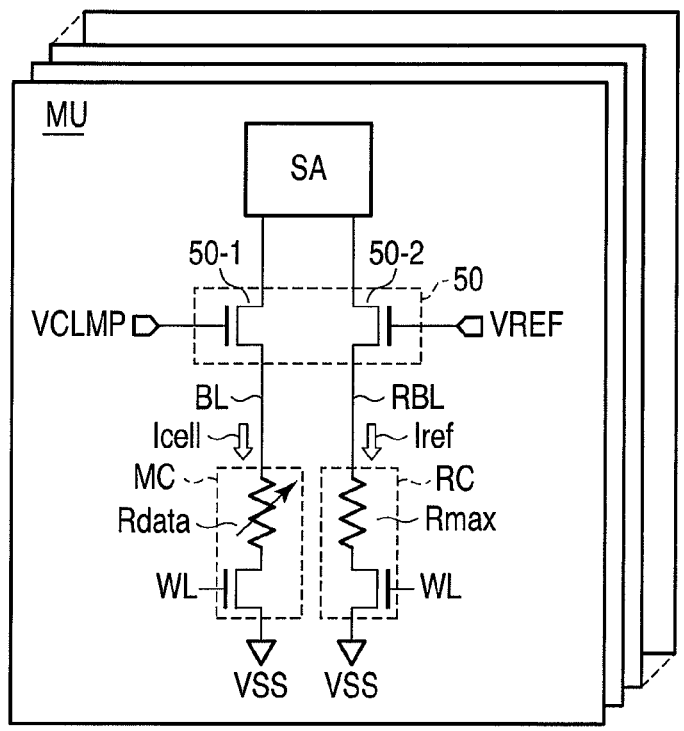
F I G. 17
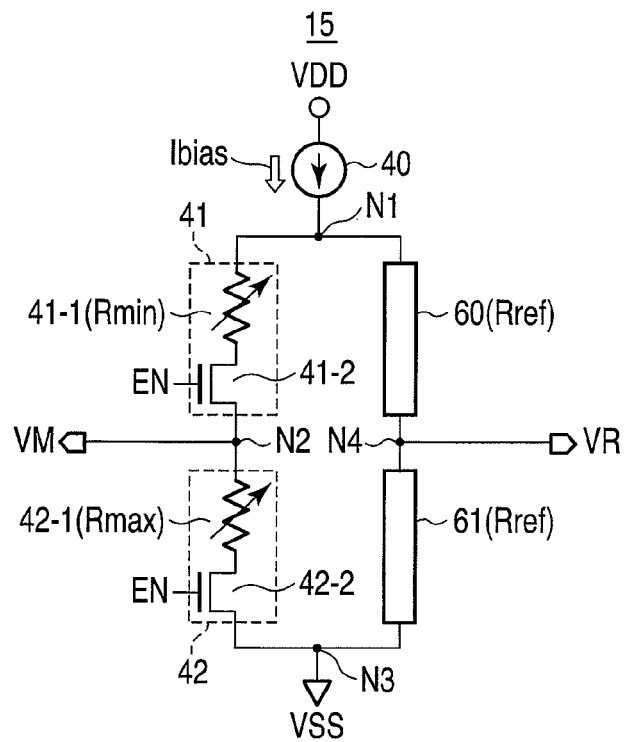
F I G. 18

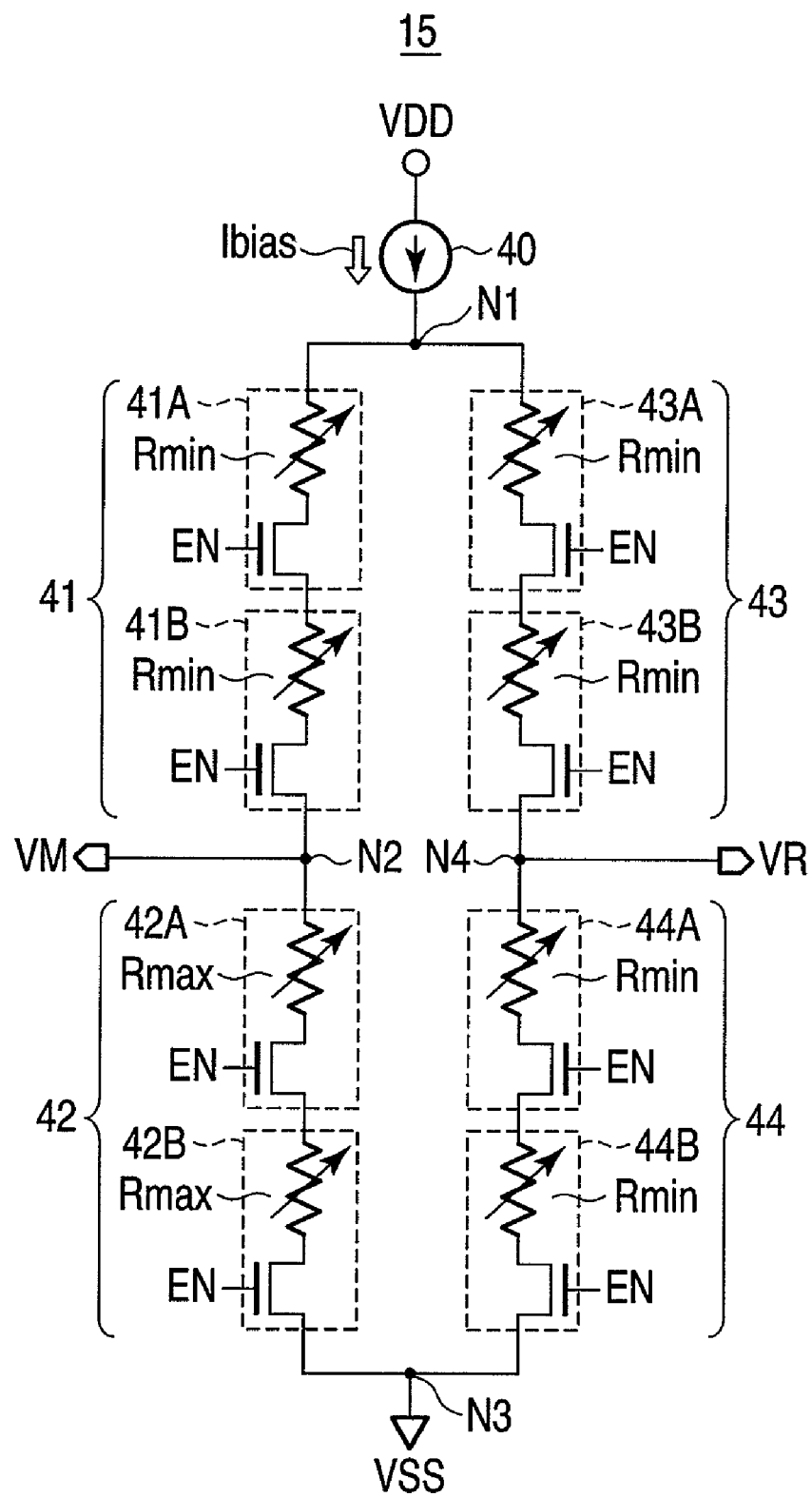
F I G. 19

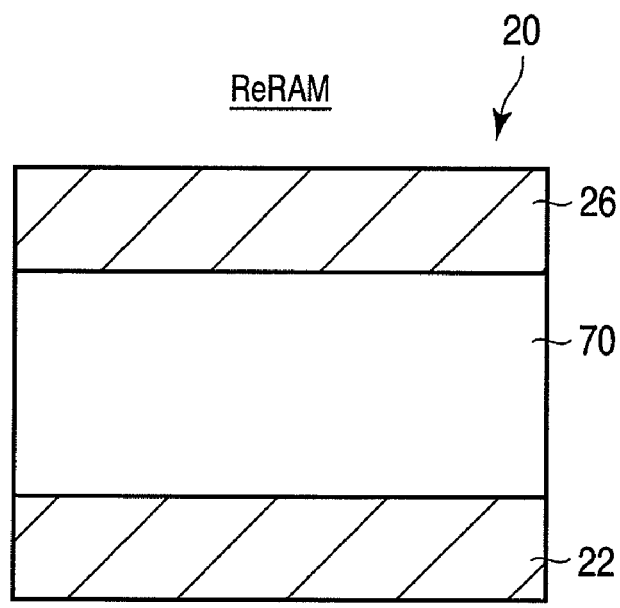
F I G. 21
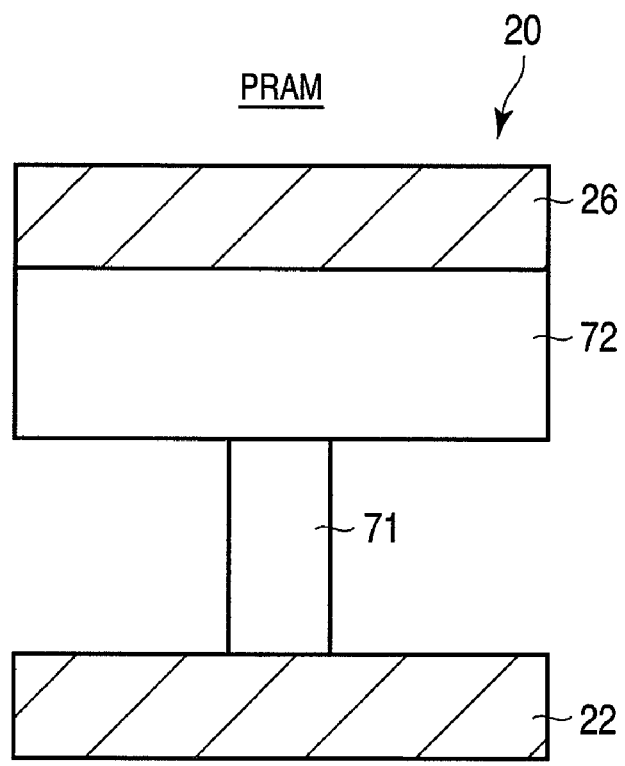
F I G. 22

SEMICONDUCTOR MEMORY DEVICE

CROSS-REFERENCE TO RELATED APPLICATIONS

This application is based upon and claims the benefit of priority from prior Japanese Patent Application No. 2008-245965, filed Sep. 25, 2008, the entire contents of which are incorporated herein by reference.

BACKGROUND OF THE INVENTION

1. Field of the Invention

The present invention relates to semiconductor memory device and, more particularly, to a semiconductor memory device comprising a variable resistance element which varies in resistance based on stored data.

2. Description of the Related Art

A magnetic random access memory (MRAM) is known as a kind of variable resistance memory. An MRAM is a device which performs memory operations by storing "1" or "0" data in a memory cell using the magnetoresistive effect, and is considered a candidate for a universal memory device characterized by non-volatility, high integration, high reliability, low power consumption, and high-speed operation.

There have been reported a great number of MRAMs using elements that show the tunneling magnetoresistive (TMR) effect among the magnetoresistive effects. A commonly used TMR effect element is a magnetic tunnel junction (MTJ) element which has a stacked structure including two ferromagnetic layers and a nonmagnetic later interposed therebetween, and uses change in magnetoresistance caused by a spin-polarized current. An MTJ element can assume either a low-resistance state or a high-resistance state according to the magnetization alignment of the two ferromagnetic layers. The low-resistance state is defined as "0", and the high-resistance state is defined as "1".

Data is read from an MRAM using an MTJ element by a method of determining a resistance of the MTJ element by applying a predetermined reading voltage to the MTJ element, and comparing an output signal current with a reference current. Alternatively, the data reading is performed by a method of determining a resistance of the MTJ element by applying a predetermined reading voltage to the MTJ element and comparing an output signal voltage with a reference voltage.

U.S. Pat. No. 6,385,109 discloses a method of generating a reference voltage at which an intermediate current between a "0" memory cell current and a "1" memory cell current upon application of a certain reading voltage is controlled to flow through a reference cell. However, since the method disclosed in the above-described document requires many operational amplifiers for generation of the reference voltage, the problems of increase in power consumption and circuit area are caused.

BRIEF SUMMARY OF THE INVENTION

According to an aspect of the present invention, there is provided a semiconductor memory device comprising: a memory cell having a first resistance state and a second resistance state based on stored data; a bit line connected to the memory cell; a reference cell configured to generate a reference current used to determine the stored data of the memory cell and fixed to the first resistance state; a reference bit line connected to the reference cell; and a generation circuit configured to generate a reading voltage applied to the memory cell and a reference voltage applied to the reference cell. The generation circuit includes: a constant current source connected to a first node; a first replica cell connected between the first node and a second node and fixed to the first resistance state; a second replica cell connected between the second node and a third node and fixed to the second resistance state; a first resistance element connected between the first node and a fourth node; and a second resistance element connected between the fourth node and the third node and having a resistance the same as a resistance of the first resistance element. The reading voltage is output from the second node, and the reference voltage is output from the fourth node.

According to an aspect of the present invention, there is provided a semiconductor memory device comprising: a memory cell having a first resistance state and a second resistance state based on stored data; a bit line connected to the memory cell; a reference cell configured to generate a reference current used to determine the stored data of the memory cell and fixed to the first resistance state; a reference bit line connected to the reference cell; and a generation circuit configured to generate a reading voltage applied to the memory cell and a reference voltage applied to the reference cell. The generation circuit includes: a constant current source connected to a first node; a first replica cell connected between the first node and a second node and fixed to the first resistance state; a second replica cell connected between the second node and a third node and fixed to the second resistance state; a third replica cell connected between the first node and a fourth node and fixed to one of the first resistance state and the second resistance state; and a fourth replica cell connected between the fourth node and the third node and having a resistance the same as a resistance of the third replica cell. The reading voltage is output from the second node, and the reference voltage is output from the fourth node.

BRIEF DESCRIPTION OF THE SEVERAL VIEWS OF THE DRAWING

FIG. 2 is a block diagram illustrating a configuration of a memory unit MU;

FIG. 3 is a circuit diagram illustrating a configuration of a memory cell MC;

FIG. 10 is a circuit diagram illustrating another configuration example of the voltage generation circuit 15;

FIG. 12 is a schematic view illustrating a configuration of a voltage transfer circuit 51 according to a second embodiment of the present invention;

FIG. 13 is a circuit diagram illustrating a configuration of a voltage transfer circuit 51;

FIG. 14 is a block diagram illustrating a configuration of the memory unit MU;

FIG. 15 is a circuit diagram illustrating a configuration of a voltage clamping circuit 50;

FIG. 16 is a circuit diagram illustrating another configuration of the voltage transfer circuit 51;

FIG. 17 is a circuit diagram illustrating a configuration of a memory unit MU, in which the voltage clamping circuit 50 according to the embodiment is centered;

FIG. 18 is a circuit diagram illustrating a configuration of a voltage generation circuit 15 according to a third embodiment of the present invention;

FIG. 19 is a circuit diagram illustrating a configuration of a voltage generation circuit 15 according to a fourth embodiment of the present invention;

FIG. 21 is a schematic view illustrating a configuration of a variable resistance element 20 used in a ReRAM; and FIG. 22 is a schematic view illustrating a configuration of a variable resistance element 20 used in a PRAM.

DETAILED DESCRIPTION OF THE INVENTION

Figure 1:
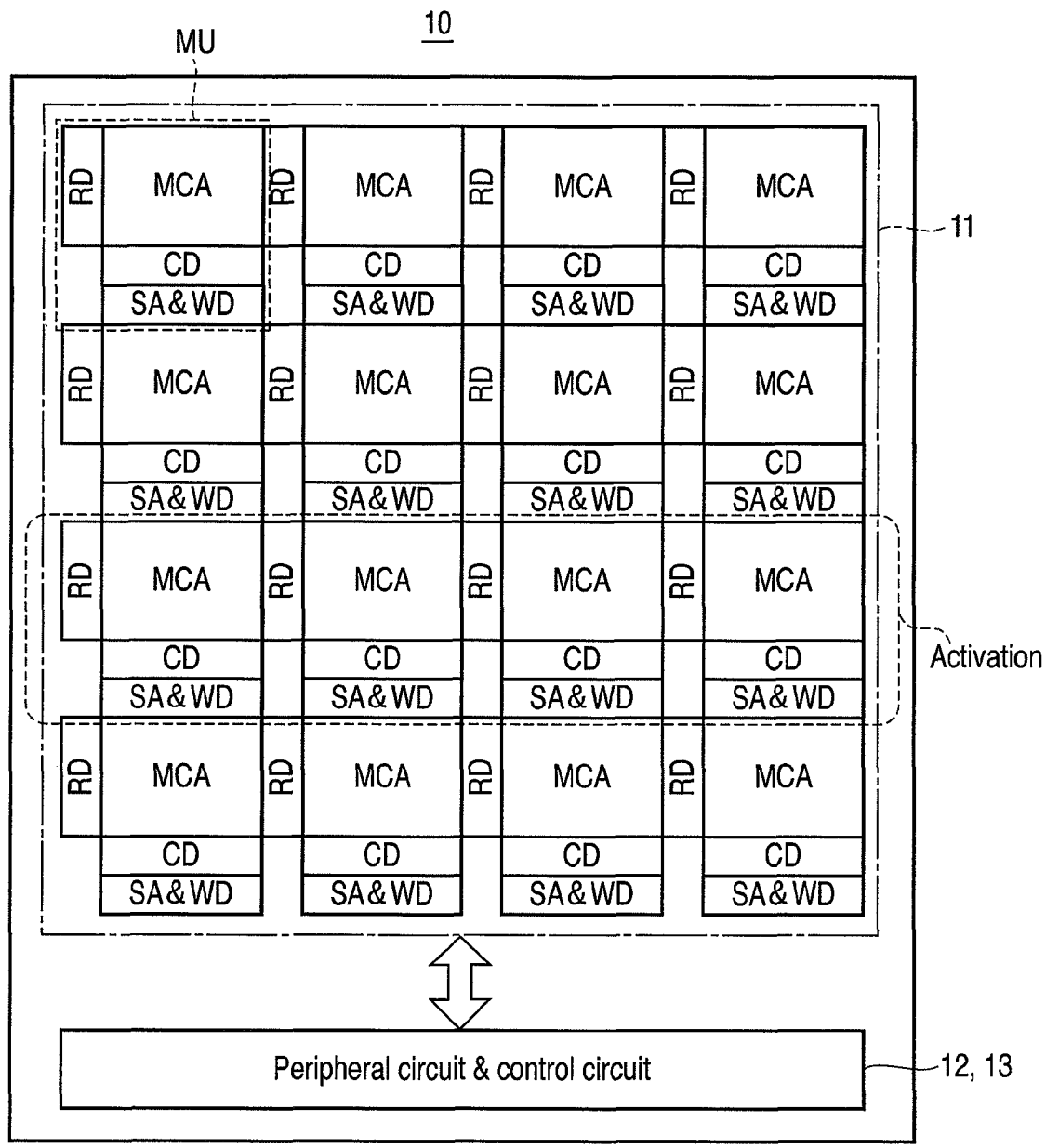
FIG. 1 is a schematic view illustrating a configuration of a variable resistance memory 10 according a first embodiment of the present invention.

The embodiments of the present invention will be described hereinafter with reference to the accompanying drawings. In the description which follows, the same or functionally equivalent elements are denoted by the same reference numerals, to thereby simplify the description.

First Embodiment

[1. Configuration of Variable Resistance Memory 10]

FIG. 1 is a schematic diagram illustrating a configuration of a variable resistance memory 10 according to a first embodiment of the present invention. The variable resistance memory 10 includes a memory core 11, a peripheral circuit 12, and a controller 13. The peripheral circuit 12 performs operations of supplying addresses and various voltages to the memory core 11, and inputting and outputting data to/from the memory core 11. The controller 13 controls operations of the memory core 11 by supplying the memory core 11 with various control signals which are necessary for data writing and reading operations.

The memory core 11 is formed of a plurality of memory units MU which are arranged in a matrix. Each of the memory units MU includes a memory cell array MCA, row decoder RD, a column decoder CD, a sense amplifier SA, and a write circuit (write driver) WD, and others. A detailed configuration of the memory unit MU will be described later.

The number of memory units MU included in the memory core 11 is not particularly limited. In this embodiment, (4×4) memory units MU are shown in FIG. 1 as an example. The number of columns of the memory core 11 corresponds to an input/output (IO) number of variable resistance memory 10. In this embodiment, since four memory units MU are arranged in a row, the IO number is 4. When the IO number of variable resistance memory 10 is 4, four memory units MU arranged in a row direction are simultaneously activated at the time of data reading or writing.

FIG. 2 is a block diagram illustrating a configuration of the memory unit MU. The memory unit MU shown in FIG. 2 extracts the part of a reading system.

The memory cell array MCA is formed of (m×n) memory cells MC arranged in a matrix, where "m" and "n" denote natural numbers equal to or more than 1. In the memory cell array MCA, word lines WL1 to WLm are arranged to extend along the row direction. In the memory cell array MCA, n bit lines BL1 to BLn are arranged to extend along the column direction. Memory cells MC are arranged at intersections of the bit lines BL and the word lines WL. Each of the memory cells MC is connected to a bit line BL and a word line WL corresponding thereto.

m reference cells RC associated with one memory cell array MCA are arranged adjacent to the memory cell array MCA in the row direction of the memory cell array MCA. The m reference cells RC are connected to one reference bit line RBL extending along the column direction, and arranged side by side along the column direction. The m reference cells RC are connected to corresponding ones of m word lines WL1 to WLm. The reference cells RC have the function of generating a reference current necessary for determining data stored in the memory cells MC.

A row decoder RD is connected to the word lines WL1 to WLm. The row decoder RD selects one of the word lines WL1 to WLm based on an address transmitted from the peripheral circuit 12.

A column decoder CD is connected to the bit lines BL1 to BLn. The column decoder CD selects one of the bit lines BL1 to BLn based on an address transmitted from the peripheral circuit 12. A column decoder CD is connected to the reference bit line RBL. The column decoder CD selects the reference bit line RBL at the time of data reading.

A voltage adjustment circuit 14 receives a reading voltage VM and a reference voltage VR supplied from the voltage generation circuit 15 included in the peripheral circuit 12. The voltage adjustment circuit 14 sets the bit line BL (i.e., the bit line BL connected to the accessed memory cell MC) selected by the column decoder CD to the reading voltage VM. The voltage adjustment circuit 14 sets the reference bit line RBL to the reference voltage VR.

At the time of data reading, the sense amplifier SA detects and amplifies data of the accessed memory cell MC using a cell current flowing through the bit line BL selected by the column decoder CD and a reference current flowing through the reference bit line RBL.

[2. Configuration of Memory Cell MC]

Various kinds of memories can be used as a variable resistance memory, such as a magnetic random access memory (MRAM), a resistive random access memory (ReRAM), and a phase-conversion random access memory (PRAM). In the descriptions of the present embodiment, an MRAM will be taken as an example. An MRAM includes a magnetic tunnel junction (MTJ) element using a tunneling magnetoresistive (TMR) effect as a memory element, and stores data according to the magnetization state of the MTJ element.

FIG. 3 is a circuit diagram illustrating a configuration of the memory cell MC. The memory cell MC includes a magnetic tunnel junction (MTJ) element 20 as a variable resistance element, and a select transistor 21. The select transistor 21 is formed of an N-channel metal oxide semiconductor field effect transistor (MOSFET), for example. One end of the MTJ element 20 is connected to a bit line BL, and the other end is connected to a drain of the select transistor 21. A gate of the select transistor 21 is connected to the word line WL. A source of the select transistor 21 is grounded via a source line, for example, at the time of data reading (by applying the ground voltage VSS).

Figure 4:
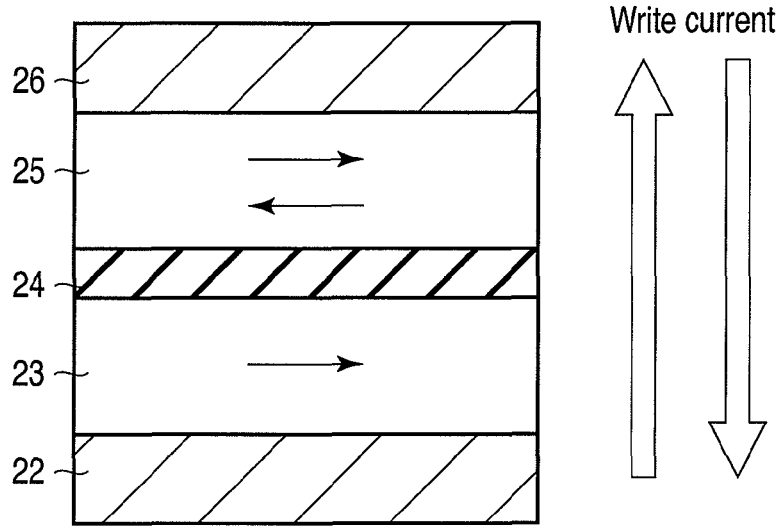
FIG. 4 is a cross-sectional view illustrating a configuration of an MTJ element 20.

FIG. 4 is a cross-sectional view illustrating a configuration of the MTJ element 20. The MTJ element 20 is formed of a lower electrode 22, a fixed layer (pinned layer) 23, an intermediate layer (nonmagnetic layer) 24, a record layer (free layer) 25, and an upper electrode 26, which are stacked sequentially. The layers forming the MTJ element 20 may be stacked in reverse order.

The fixed layer 23 is formed of a ferromagnetic material, which has a fixed magnetization direction. For example, by providing an antiferromagnetic layer (not shown) adjacent to the fixed layer 23, the magnetization direction of the fixed layer 23 can be fixed. The free layer 25 is formed of a ferromagnetic material, which has a variable magnetization direction. The intermediate layer 24 is formed of a nonmagnetic material, and more specifically, a non-magnetic metal, a non-magnetic semiconductor, or an insulator can be used. The intermediate layer 24 is referred to as a tunnel barrier when an insulator is used therefor, and is referred to as a spacer when a metal is used therefor.

The easy magnetization direction of the fixed layer 23 and the free layer 25 may be perpendicular to a film surface (perpendicular magnetization), or parallel to the film surface (in-plane magnetization). Since the perpendicular magnetization does not require control of the element shape to determine the magnetization direction, unlike the in-plane magnetization, the perpendicular magnetization has an advantage in suitability for miniaturization.

Each of the fixed layer 23 and the free layer 25 is not limited to a single layer as shown, and may has a stacked structure including a plurality of ferromagnetic layers. Each of the fixed layer 23 and the free layer 25 may have an antiferromagnetically coupled structure which includes three layers (first ferromagnetic layer/nonmagnetic layer/second ferromagnetism layer) and in which magnetization coupling (interlayer exchange coupling) is made such that the magnetization directions of the first and second ferromagnetic layers become antiparallel, or may have a ferromagnetically coupled structure in which magnetic coupling (interlayer exchange coupling) is made such that the magnetization directions of the first and second ferromagnetic layers become parallel.

The MTJ element 20 may have a double junction structure. The MTJ element 20 with a double junction structure has a stacked structure in which a first fixed layer, a first intermediate layer, a free layer, a second intermediate layer, and a second fixed layer are sequentially stacked. Such a double junction structure has an advantage of easily controlling magnetization inversion of the free layer 25 by spin injection.

Figure 5:
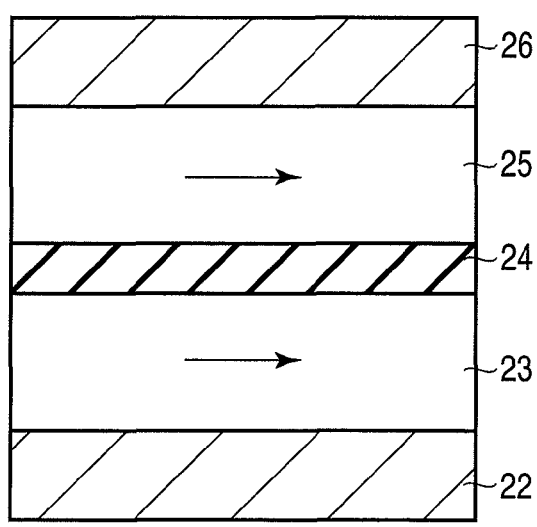
FIG. 5 illustrates a low-resistance state and a high-resistance state of the MTJ element 20.
Figure 5:
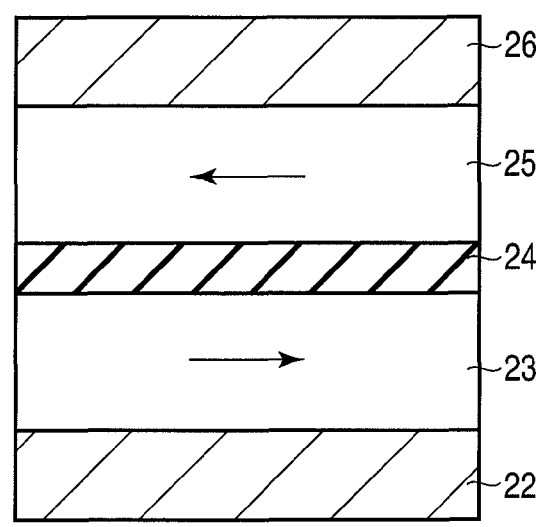

FIG. 5 illustrates a low-resistance state and a high-resistance state of the MTJ element 20. Hereinafter, the low-resistance state and the high-resistance state of the MTJ element 20 by a spin injection write method will be described below. In this description, a current denotes a flow of electrons.

First, a parallel state (low-resistance state), in which a magnetization directions of the fixed layer 23 and the free layer 25 become parallel, will be described. In this case, a current flowing from the fixed layer 23 to the free layer 25 is supplied.

The majority of electrons which have passed the fixed layer 23 have spins parallel to the magnetization direction of the fixed layer 23. When the spin angular momentum of the majority of electrons moves to the free layer 25, a spin torque is applied to the free layer 25, and the magnetization direction of the free layer 25 is aligned parallel to the magnetization direction of the fixed layer 23. In the parallel alignment, the MTJ element 20 has the smallest resistance, which case is defined as "0" data. The resistance in the low-resistance state is expressed as Rmin.

Second, an antiparallel state (high-resistance state), in which magnetization directions of the fixed layer 23 and the free layer 25 become antiparallel, will be described. In this case, a current flowing from the free layer 25 to the fixed layer 23 is supplied. The majority of electrons which have been reflected by the fixed layer 23 has a spin antiparallel to the magnetization direction of the fixed layer 23. When the spin angular momentum of the majority of electrons moves to the free layer 25, a spin torque is applied to the free layer 25, and the magnetization direction of the free layer 25 is aligned untiparallel to the magnetization direction of the fixed layer 23. In the antiparallel alignment, the MTJ element 20 has the largest resistance, which case is defined as "1" data. The resistance of the high-resistance state is expressed as Rmax.

Figure 6:
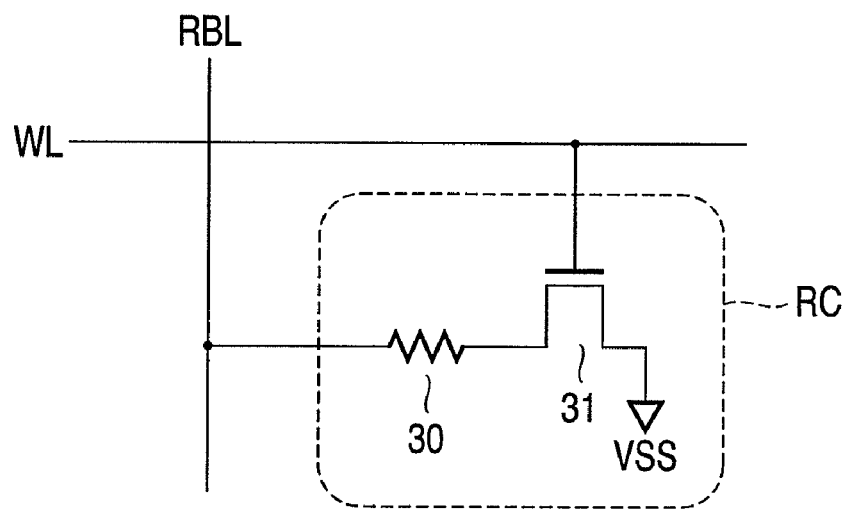
FIG. 6 is a circuit diagram illustrating a configuration of a reference cell RC.

FIG. 6 is a circuit diagram illustrating a configuration of the reference cell RC. The reference cell RC includes a fixed resistance element 30 and a select transistor 31. The select transistor 31 is formed of an N-channel MOSFET, for example. One end of the fixed resistance element 30 is connected to the reference bit line RBL, and the other end is connected to a drain of the select transistor 31. A gate of the select transistor 31 is connected to the word line WL. The source of the select transistor 31 is grounded via a source line, for example.

The fixed resistance element 30 is fixed to the resistance Rmin of the memory cell MC in a low-resistance state. The fixed resistance element 30 is formed by a process similar to that of the MTJ element 20, and has a stacked structure similar to that of the MTJ element 20. Two magnetic layers forming the fixed resistance element 30 are fixed so that the magnetization states form parallel alignment.

[3. Configuration of Voltage Generation Circuit 15]

Figure 7:
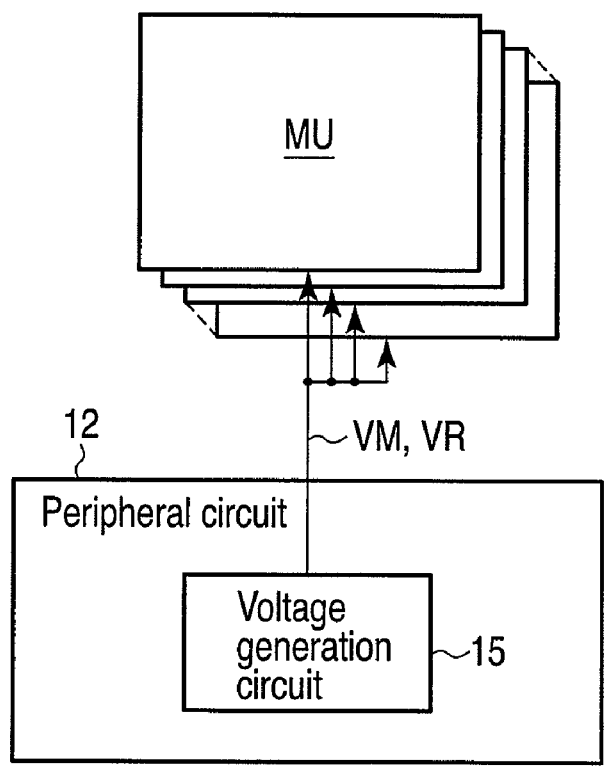
FIG. 7 is a schematic view illustrating a configuration of a voltage generation circuit 15.

Next, the configuration of the voltage generation circuit 15, which supplies a reading voltage VM and a reference voltage VR to each of the memory units MU, will be described. FIG. 7 is a schematic diagram illustrating a configuration of the voltage generation circuit 15. One voltage generation circuit 15, which is included in the peripheral circuit 12, is provided for all the memory units MU. The voltage generation circuit 15 generates a reading voltage VM and reference voltage VR, and supplies them to each of the memory units MU.

Figure 8:
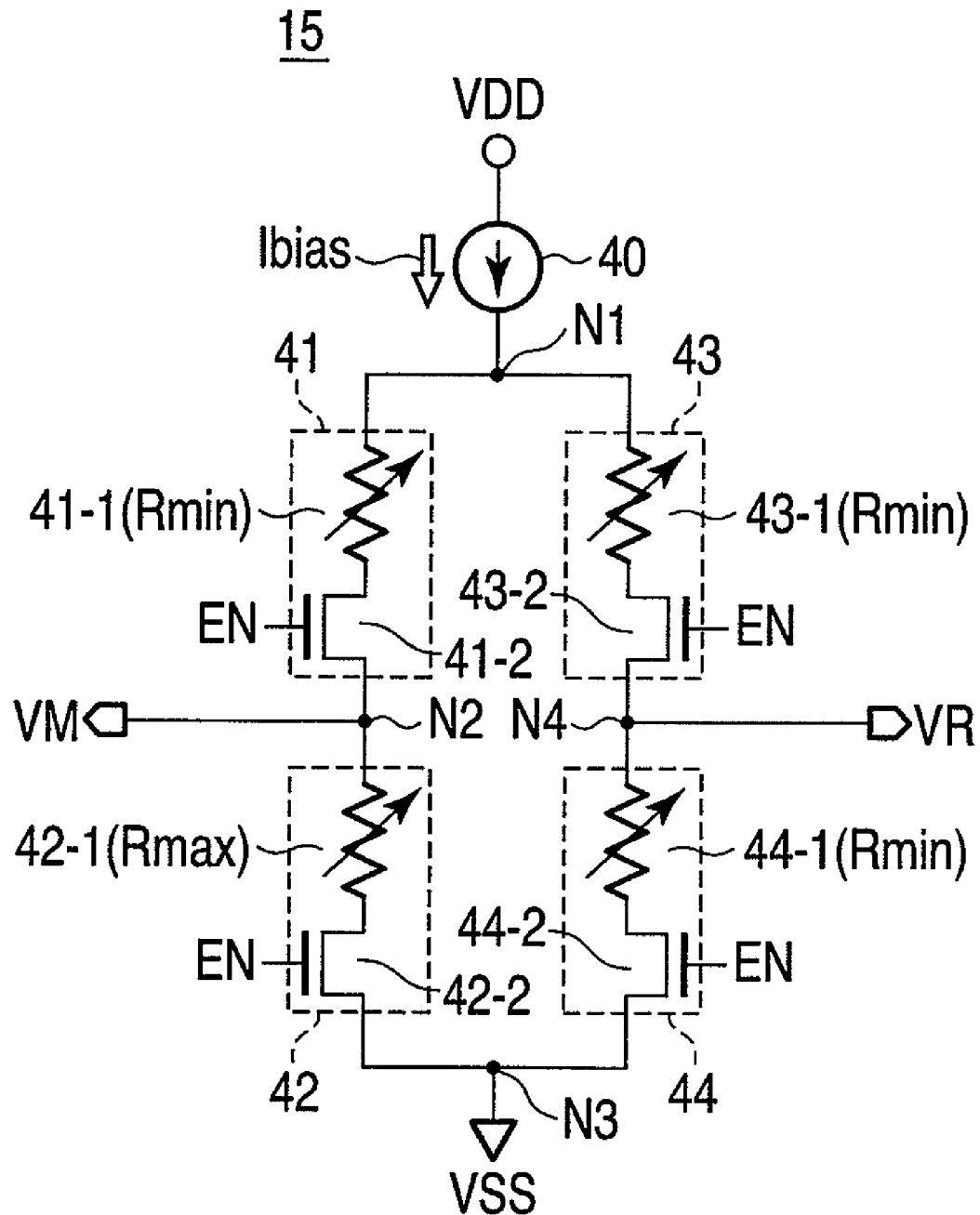
FIG. 8 is a circuit diagram illustrating a configuration of the voltage generation circuit 15.

FIG. 8 is a circuit diagram illustrating a configuration of the voltage generation circuit 15. The voltage generation circuit 15 includes a constant current source 40 and four replica cells 41 to 44. The four replica cells 41 to 44 have configurations similar to that of the memory cell MC, and can assume a resistance state the same as that of the memory cell MC. The replica cell 41 includes a variable resistance element 41-1 and a select transistor 41-2 connected in series.

The replica cells 42 to 44 have a configuration similar to that of the replica cell 41.

A constant current source 40 is connected between a power voltage terminal VDD and a node N1, and supplies a bias current Ibias to the node N1. One end of the current path of the replica cell 41 is connected to the node N1, and the other end is connected to a node N2. One end of the current path of the replica cell 42 is connected to the node N2, and the other end is connected to a node N3. One end of the current path of the replica cell 43 is connected to the node N1, and the other end is connected to a node N4. One end of the current path of the replica cell 44 is connected to the node N4, and the other end is connected to the node N3. The node N3 is grounded.

The variable resistance element 41-1 is fixed to a resistance the same as that of the reference cell RC, that is, the resistance Rmin of a memory cell MC in a low-resistance state. The variable resistance element 42-1 is fixed to the resistance Rmax of a memory cell MC in a high-resistance state. The variable resistance element 43-1 is fixed to the resistance Rmin. The variable resistance element 44-1 is fixed to a resistance the same as that of the variable resistance element 43-1, that is, the resistance Rmin. The variable resistance elements 43-1 and 44-1 may be fixed to the resistance Rmax.

A control signal (read-enable signal) EN is supplied from the controller 13 to gates of the select transistors 41-2, 42-2, 43-2 and 44-2. The read enable signal EN is activated (set to a high level) during a reading operation, and is deactivated (set to a low level) in other operations. Accordingly, the select transistors 41-2, 42-2, 43-2 and 44-2 are turned on at the time of a reading operation.

The voltage generation circuit 15 with the above-described configuration outputs a reading voltage VM to be applied to the memory cell MC from the node N2, and outputs a reference voltage VR to be applied to the reference cell RC from the node N3. When the resistances of the variable resistance elements 41-1, 42-1, 43-1 and 44-1 (i.e., resistances of the replica cells 41, 42, 43 and 44) are fixed as shown in FIG. 8, the reference voltage VR is calculated by the following equation:

$$VR = (VM/2) \times (1 + Rmin/Rmax)$$

Since the resistance of the reference cell RC is fixed to Rmin, a reference current Iref flowing through the reference cell RC upon application of the reference voltage VR is calculated by the following equation:

$$Iref = VR/Rmin = (VM/2) \times (1/Rmin + 1/Rmax)$$

As clear from this equation, the reference current Iref is set to an intermediate current between a cell current flowing through a "0" memory cell (memory cell storing "0" data) to which a reading voltage VM is applied, and a cell current flowing through a "1" memory cell (memory cell storing "1" data) to which a reading voltage VM is applied.

The reading voltage VM is controlled by a bias current Ibias supplied from the constant current source 40, and is calculated by the following equation:

$$VM = 2 \times Ibias \times Rmin \times Rmax/(Rmin + Rmax)$$

[4. Configuration of Voltage Adjustment Circuit 14]

Figure 9:
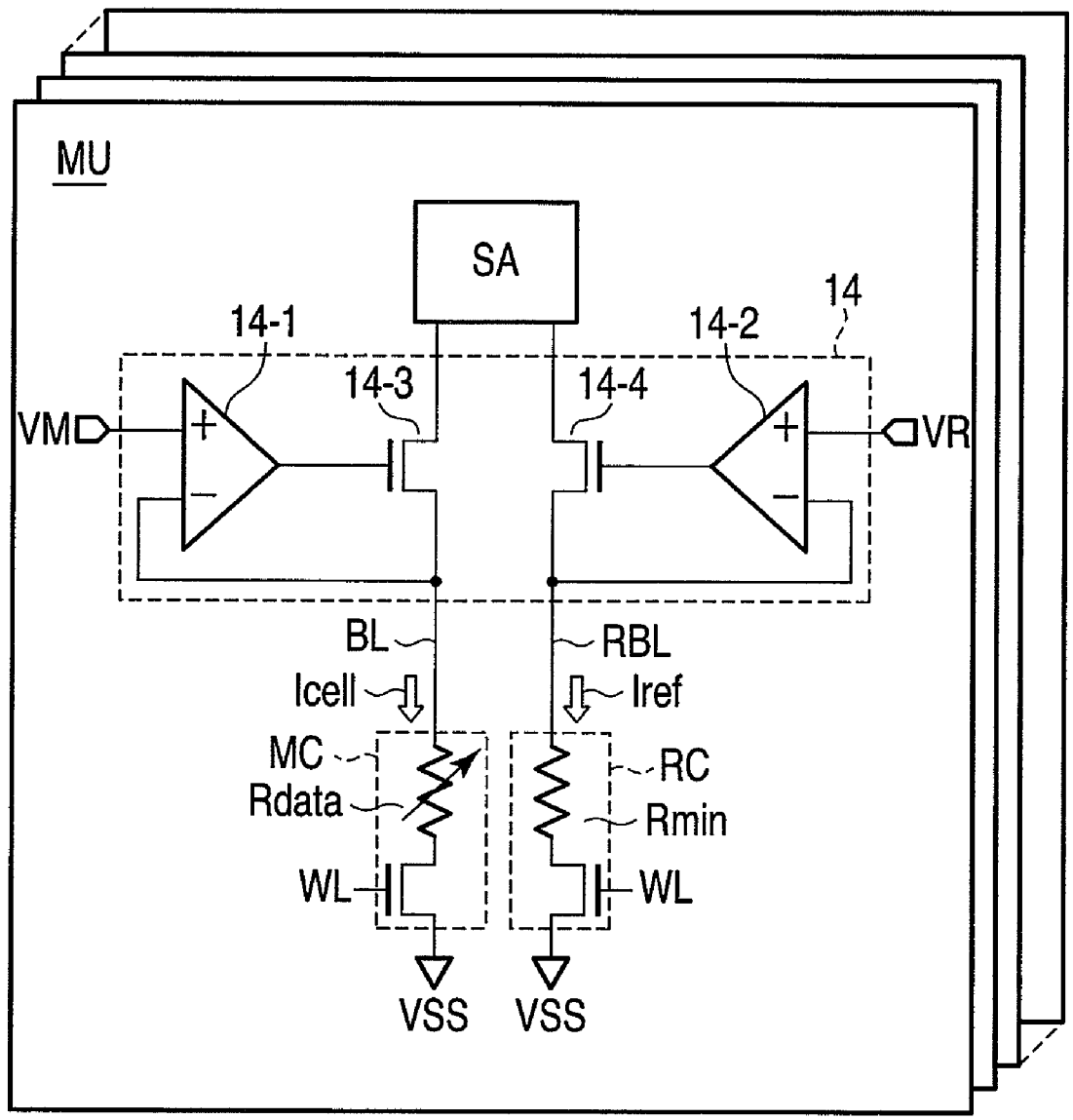
FIG. 9 is a circuit diagram illustrating a configuration of a voltage adjustment circuit 14.

Next, a configuration of the voltage adjustment circuit 14 included in each of the memory units MU will be described. FIG. 9 is a circuit diagram illustrating a configuration of the voltage adjustment circuit 14. FIG. 9 illustrates a state in which a bit line BL selected by the column decoder CD and a reference bit line RBL selected by the column decoder CD are connected to the voltage adjustment circuit 14 and the sense amplifier SA.

The voltage adjustment circuit 14 includes two operational amplifiers 14-1 and 14-2 and two N-channel MOSFETs 14-3 and 14-4. A drain of the MOSFET 14-3 is connected to a first input terminal of the sense amplifier SA. A source of the MOSFET 14-3 is connected to a bit line BL, which is connected to an accessed memory cell MC, via a column decoder CD (not shown). A gate of the MOSFET 14-3 is connected to an output terminal of the operational amplifier 14-1. A reading voltage VM is supplied to a non-inverting input terminal of the operational amplifier 14-1 from the voltage generation circuit 15. An inverting input terminal of the operational amplifier 14-1 is connected to the source of the MOSFET 14-3.

A drain of the MOSFET 14-4 is connected to a second input terminal of the sense amplifier SA. A source of the MOSFET 14-4 is connected to the reference bit line RBL via the column decoder CD (not shown). The gate of the MOSFET 14-4 is connected to an output terminal of the operational amplifier 14-2. A reference voltage VR is supplied to a non-inverting input terminal of the operational amplifier 14-2 from the voltage generation circuit 15. The inverting input terminal of the operational amplifier 14-2 is connected to the source of the MOSFET 14-4.

In the voltage adjustment circuit 14 with the above-described configuration, the bit line BL is set to the reading voltage VM by the operational amplifier 14-1, and the reference bit line RBL is set to the reference voltage VR by the operational amplifier 14-2. Accordingly, the reading voltage VM is applied to the accessed memory cell MC, and the reference voltage VR is applied to the reference cell RC. When data is read, a reference cell RC in a row the same as that of the accessed memory cell MC, that is, the reference cell RC connected to the word line WL the same as that of the accessed memory cell MC, for example, is connected to the reference bit line RBL.

In this case, the memory cell MC has a resistance Rdata relating to the stored data thereof, and a cell current Icell, which is determined by the resistance Rdata and the reading voltage VM, flows through the bit line BL. On the other hand, the resistance of the reference cell RC is fixed to Rmin, and a reference current Iref which is determined by the resistance Rmin and the reference voltage VR flows through the reference bit line RBL. The reference current Iref is set to an intermediate current between a cell current flowing through a "0" memory cell to which the reading voltage VM is applied, and a cell current flowing through a "1" memory cell to which the reading voltage VM is applied, as shown in the above-described relation. Accordingly, the sense amplifier SA can determine the resistance state of an accessed memory cell MC by comparing the cell current Icell with the reference current Iref, and thereby the data stored in the memory cell MC can be detected.

[5. Example]

The resistance of the reference cell RC and the resistance of the replica cell may be the inverse of the resistances shown in FIGS. 8 and 9. Even with the voltage generation circuit 15 and the reference cell RC with such a configuration, a desired reference current Iref can be generated.

FIG. 10 is a circuit diagram illustrating another configuration example of the voltage generation circuit 15. A variable resistance element 41-1 included in the replica cell 41 is fixed to a resistance Rmax of a memory cell MC in a high-resistance state. A variable resistance element 42-1 included in the replica cell 42 is fixed to the resistance Rmin of a memory cell MC in a low-resistance state. A variable resistance element 43-1 included in the replica cell 43 is fixed to the resistance Rmax. A variable resistance element 44-1 included in the replica cell 44 is fixed to a resistance the same as that of the variable resistance element 43-1, that is, the resistance Rmax. The variable resistance elements 43-1 and 44-1 may be fixed to the resistance Rmin.

Figure 11:
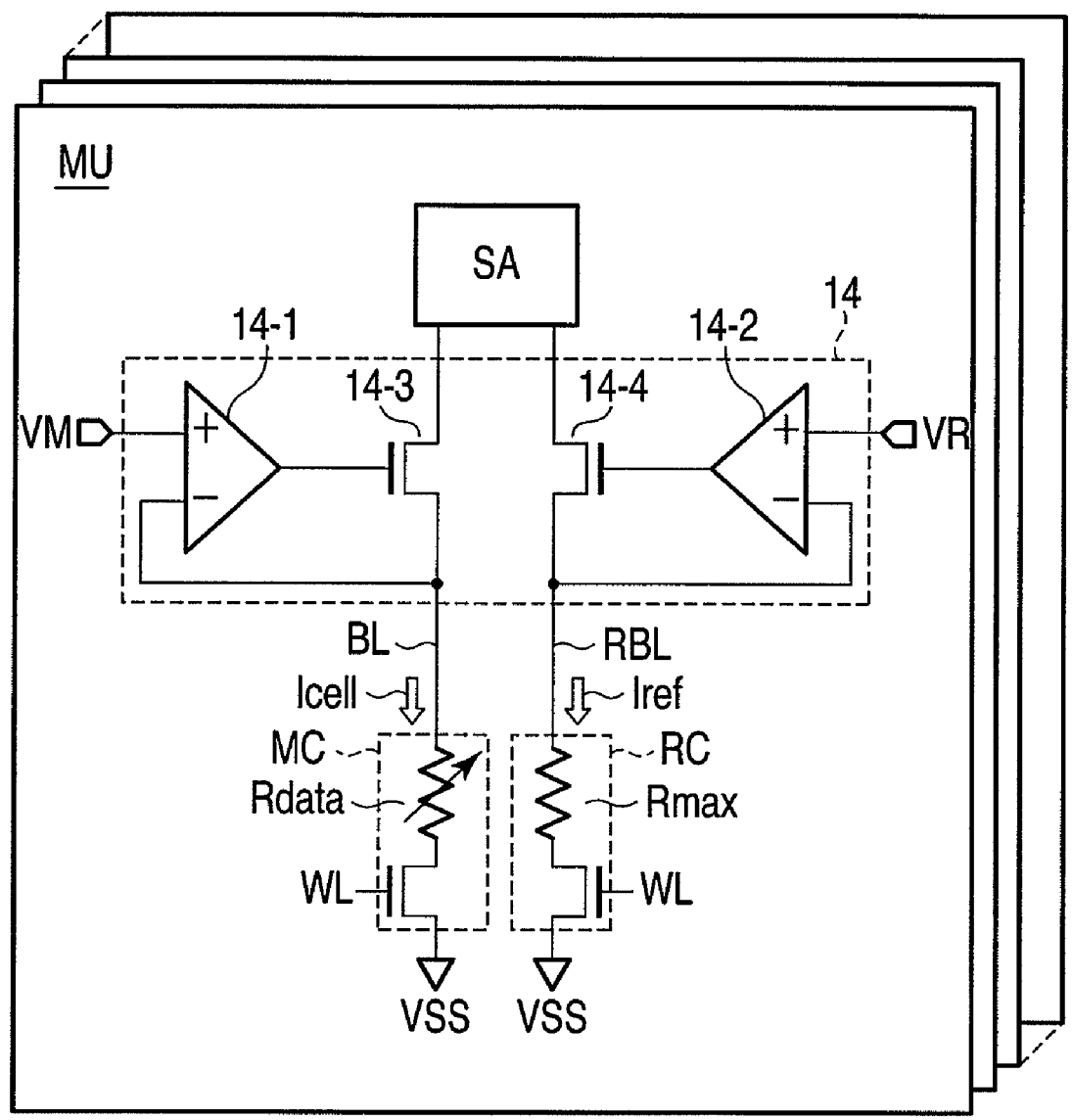
FIG. 11 is a circuit diagram illustrating a configuration of the memory unit MU in which the voltage adjustment circuit 14 according to the embodiment is centered.

FIG. 11 is a circuit diagram illustrating a configuration of the memory unit MU in which the voltage adjustment circuit 14 is centered. The configuration of the voltage adjustment circuit 14 is the same as that in FIG. 9.

As shown in FIG. 11, the resistance of the reference cell RC is fixed to a resistance the same as that of the replica cell 41 (more specifically, the variable resistance element 41-1), that is, the resistance Rmax. Accordingly, a reference current Iref determined by the resistance Rmax and the reference voltage VR flows through the reference bit line RBL.

When the resistance of the variable resistance elements 41-1, 42-1, 43-1 and 44-1 (i.e., resistance of the replica cells 41, 42, 43 and 44) is fixed as shown in FIG. 10, the reference voltage VR is calculated by the following equation:

$$VR=(VM/2)\times(1+Rmax/Rmin)$$

Since the resistance of the reference cell RC is fixed to Rmax, the reference current Iref which flows through the reference cell RC upon application of the reference voltage VR is calculated by the following equation:

$$Iref=VR/Rmax=(VM/2)\times(1/Rmin+1/Rmax)$$

As clear from this equation, the reference current Iref is set to an intermediate current between a cell current flowing through a "0" memory cell to which the reading voltage VM is applied and a cell current flowing through a "1" memory cell to which the reading voltage VM is applied.

In the first embodiment, as described above, the voltage generation circuit 15 which generates the reading voltage VM, which is applied to the memory cell MC when data is read, and a reference voltage VR, which is applied to the reference cell RC, is formed using the four replica cells 41 to 44. Further, by fixing the resistance of the reference cell RC to Rmin and fixing the resistance of the replica cells 41 to 44 to a predetermined resistance shown in FIG. 8, the reference current Iref flowing through the reference cell RC upon application of the reference voltage VR is set to an intermediate current between the cell currents in a low-resistance state and a high-resistance state.

Accordingly, according to the first embodiment, a replica cell with a configuration similar to that of the memory cell MC follows the characteristics of the memory cell MC upon fluctuation in temperature or variation in power supply. Thus, when the resistances of the memory cell MC in the low-resistance state and the high-resistance state vary, the reading voltage VM and the reference voltage VR similarly vary. It is thereby possible to reduce the influence on data reading operation caused by fluctuation in temperature or variation in power supply. This results in attainment of high-precision reading operation and improvement in reliability.

Further, since the voltage generation circuit 15 can be formed without using operational amplifiers, the number of operational amplifiers used in the entire reading circuit can be reduced. This enables reduction of power consumption and reduction of the circuit area.

Second Embodiment

In a second embodiment, the number of operational amplifiers is further decreased in comparison with the first embodiment. Accordingly, the voltage clamping circuit 50 formed of MOSFETs is provided for each of the memory units MU, and the voltage clamping circuit 50 sets the bit line BL and the reference bit line RBL to a predetermined reading voltage and reference voltage. Further, a voltage transfer circuit 51 generating a reading control voltage VCLMP to be applied to MOSFETs forming the voltage clamping circuit 50 and a control voltage VREF is newly provided in the peripheral circuit 12.

[1. Configuration of Voltage Transfer Circuit 51]

FIG. 12 is a schematic diagram illustrating a configuration of a voltage transfer circuit 51 according to the second embodiment of the present invention. One voltage transfer circuit 51, which is included in the peripheral circuit 12, is provided for all the memory units MU. The voltage transfer circuit 51 receives a reading voltage VM and a reference voltage VR from a voltage generation circuit 15. The voltage transfer circuit 51 generates a reading control voltage VCLMP and a control voltage VREF using the reading voltage VM and the reference voltage VR. The reading control voltage VCLMP and the control voltage VREF are supplied to each of the memory units MU. The configuration of the voltage generation circuit 15 is the same as that in FIG. 8.

FIG. 13 is a circuit diagram illustrating a configuration of the voltage transfer circuit 51. The voltage transfer circuit 51 includes a dummy sense amplifier 52, two operational amplifiers 53 and 54, two N-channel MOSFETs 55 and 56, and two replica cells 57 and 58. The dummy sense amplifier 52 has a configuration the same as that of the sense amplifier SA.

A drain of the MOSFET 55 is connected to a first input terminal of the dummy sense amplifier 52. A source of the MOSFET 55 is connected to the replica cell 57. A gate of the MOSFET 55 is connected to an output terminal of the operational amplifier 53. The reading voltage VM is supplied to a non-inverting input terminal of the operational amplifier 53 from the voltage generation circuit 15. An inverting input terminal of the operational amplifier 53 is connected to the source of the MOSFET 55. A drain of the MOSFET 56 is connected to a second input terminal of the dummy sense amplifier 52. A source of the MOSFET 56 is connected to the replica cell 58. A gate of the MOSFET 56 is connected to an output terminal of the operational amplifier 54. The reference voltage VR is supplied to a non-inverting input terminal of the operational amplifier 54 from the voltage generation circuit 15. An inverting input terminal of operational amplifier 54 is connected to the source of the MOSFET 56.

The two replica cells 57 and 58 have configurations similar to that of the memory cell MC, and can assume a resistance state the same as that of the memory cell MC. The replica cell 57 is formed of a variable resistance element 57-1 and a select transistor 57-2 connected in series. The replica cell 58 is formed of a variable resistance element 58-1 and a select transistor 58-2 connected in series.

Each of the variable resistance elements 57-1 and 58-1 is fixed to a resistance Rmin of a memory cell MC in a low-resistance state. Each of the variable resistance elements 57-1 and 58-1 may be fixed to a resistance Rmax of a memory cell MC in a high-resistance state. A control signal (a read-enable signal) EN is supplied to gates of the select transistor 57-2 and 58-2 from the controller 13.

Accordingly, the select transistors 57-2 and 58-2 are turned on at the time of a reading operation.

The voltage transfer circuit 51 with the above-described configuration generates a reading control voltage VCLMP from an output terminal of the operational amplifier 53, and generates a control voltage VREF from an output terminal of the operational amplifier 54. The source voltage of the MOSFET 55 (i.e., voltage to be applied to the replica cell 57) is set to a reading voltage VM by the operational amplifier 53. Further, the source voltage (i.e., voltage to be applied to the replica cell 58) of the MOSFET 56 is set to a reference voltage VR by the operational amplifier 54. Accordingly, the gate voltage of the MOSFET 55 corresponding to the reading control voltage VCLMP is set to "VM+Vth", and the gate voltage of the MOSFET 56 corresponding to the control voltage VREF is set to "R+Vth", where "Vth" is a threshold voltage of the MOSFET. The reading control voltage VCLMP and the control voltage VREF are supplied to each of the memory units MU.

[2. Configuration of Voltage Clamping Circuit 50]

Next, a configuration of the voltage clamping circuit 50 included in each of the memory units MU will be described. FIG. 14 is a block diagram illustrating a configuration of one memory unit MU. In the memory unit MU shown in FIG. 14, a part of a reading system is extracted.

A voltage clamping circuit 50 included in each of the memory units MU is connected between a sense amplifier SA and a column decoder CD (more specifically, a selected bit line BL and a reference bit line RBL). The voltage clamping circuit 50 receives a reading control voltage VCLMP and a control voltage VREF from the voltage transfer circuit 51. The voltage clamping circuit 50 sets the selected bit line BL and the reference bit line RBL to a reading voltage VM and a reference voltage VR, respectively, using the reading control voltage VCLMP and the control voltage VREF.

FIG. 15 is a circuit diagram illustrating a configuration of the voltage clamping circuit 50.

The voltage clamping circuit 50 includes two N-channel MOSFETs 50-1 and 50-2 for voltage clamping. A drain of the MOSFET 50-1 is connected to a first input terminal of the sense amplifier SA. A drain of the MOSFET 50-1 is connected to a bit line BL connected to an accessed memory cell MC via the column decoder CD (not shown). The reading control voltage VCLMP is supplied to a gate of the MOSFET 50-1 from the voltage transfer circuit 51.

A drain of the MOSFET 50-2 is connected to a second input terminal of the sense amplifier SA.

The drain of the MOSFET 50-2 is connected to the reference bit line RBL via a column decoder CD (not shown). The control voltage VREF is supplied to a gate of the MOSFET 50-2 from the voltage transfer circuit 51.

The voltage clamping circuit 50 with the above-described configuration sets the bit line BL to the voltage obtained by subtracting the threshold voltage Vth of the MOSFET 50-1 from the reading control voltage VCLMP, i.e., the reading voltage VM. Further, the voltage clamping circuit 50 sets the reference bit line RBL to the voltage obtained by subtracting the threshold voltage Vth of the MOSFET 50-2 from the control voltage VREF, that is, the reference voltage VR. Accordingly, the reading voltage VM is applied to the accessed memory cell MC, and the reference voltage VR is applied to the reference cell RC.

Accordingly, as in the case of the first embodiment, the reference current Iref flowing through the reference cell RC is set to a current between a cell current flowing through a "0" memory cell to which a reading voltage VM is applied and a cell current flowing through a "1" memory cell to which a reading voltage VM is applied, as shown in the above-described relation.

[3. Example]

The resistance of each of the reference cell RC and the replica cell may be the inverse of the resistances shown in FIGS. 8, 13 and 15. Even when the voltage generation circuit 15, the voltage transfer circuit 51 and the reference cell RC with the above-described configuration, a desired reference current Iref can be generated. The configuration of the voltage generation circuit 15 of the present example, in which the resistance of the replica cell is inverted, is the same as that of FIG. 10.

FIG. 16 is a circuit diagram illustrating another configuration example of the voltage transfer circuit 51. A variable resistance element 57-1 included in a replica cell 57 is fixed to a resistance Rmax of a memory cell in a high-resistance state. A variable resistance element 58-1 included in a replica cell 58 is fixed to a resistance Rmax. Each of the variable resistance elements 57-1 and 58-1 may be fixed to a resistance Rmin of a memory cell MC in a low-resistance state.

FIG. 17 is a circuit diagram illustrating a configuration of a memory unit MU, in which the voltage clamping circuit 50 is centered. The configuration of the voltage clamping circuit 50 is the same as that of FIG. 15.

As shown in FIG. 17, the resistance of the reference cell RC is fixed to the resistance the same as that of the replica cell 41 (more specifically, the variable resistance element 41-1), that is, the resistance Rmax. Accordingly, a reference current Iref determined based on the resistance Rmax and the reference voltage VR flows through a reference bit line RBL.

Even with the reference cell RC and the voltage transfer circuit 51 with the above-described configurations, the reference current Iref flowing through the reference cell RC is set to an intermediate current between a cell current flowing through a "0" memory cell to which a reading voltage VM is applied and a cell current flowing through a "1" memory cell to which a reading voltage VM is applied, as in the case of the first embodiment.

As described above, in the second embodiment, one voltage transfer circuit 51, which has a function similar to that of the two operational amplifiers arranged in each memory unit MU in the first embodiment, is provided in the peripheral circuit 12, for all the memory units MU. Accordingly, operational amplifiers used to adjust the voltage of the bit line BL and the reference bit line RBL are not arranged in each of the memory units MU.

Thus, according to the second embodiment, the number of the operational amplifiers used in the entire reading circuit can be further reduced, as compared to the first embodiment. This enables reduction of power consumption and reduction of circuit area. Further, by using the replica cells, the effect of reducing the influence on data reading operation caused by fluctuation in temperature or variation in power supply can be obtained, as in the case of the first embodiment.

Third Embodiment

A third embodiment is a modification example of the first embodiment, and describes another configuration example of the voltage generation circuit 15. FIG. 18 is a circuit diagram illustrating a configuration of a voltage generation circuit 15 according to the third embodiment of the present invention.

In the voltage generation circuit 15 according to the third embodiment, the replica cell 43 of FIG. 8 is replaced with a fixed resistance element 60, and the replica cell 44 is replaced with a fixed resistance element 61. The resistance of each of the fixed resistance elements 60 and 61 is fixed to Rref.

The resistance Rref can be arbitrarily set.

Each of the fixed resistance elements 60 and 61 is formed of a polycrystalline silicon, or a diffusive resistor in which a semiconductor substrate is doped with impurity, for example.

In the voltage generation circuit 15 with the above-described configuration, each of the reference voltage VR and the reference current Iref is calculated by a relation the same as the relation described in the first embodiment. Accordingly, the reference current Iref is set to an intermediate current between a cell current flowing through "0" memory cell to which a reading voltage VM is applied and a cell current flowing through a "1" memory cell to which a reading voltage VM is applied.

Further, the reading voltage VM is calculated by the following equation:

$$VM = 2 \times I\text{bias} \times R\text{ref} \times R\text{max}/(R\text{min} + R\text{max}))$$

As described above, according to the third embodiment, even with a fixed resistance element replacing a part of the replica cell forming the voltage generation circuit 15, a desired reference current Iref can be generated.

The voltage generation circuit 15 described in the third embodiment can also be applied to the second embodiment.

Fourth Embodiment

In a fourth embodiment, which is a modification example of the first embodiment, each of four replica cells 41 to 44 used in a voltage generation circuit 15 is formed of a plurality of replica cells connected in series.

FIG. 19 is a circuit diagram illustrating a configuration of the voltage generation circuit 15 according to the fourth embodiment of the present invention. In the fourth embodiment, instead of one replica cell 41 shown in FIG. 8 of the first embodiment, two replica cells 41A and 41B connected in series are used. Each of the two replica cells 41A and 41B is formed of a variable resistance element and a select transistor connected in series. The variable resistance element included in each of the replica cells 41A and 41B is fixed to the resistance the same as that of the reference cell RC, that is, the resistance Rmin of a memory cell MC in a low-resistance state.

Similarly, in FIG. 19, instead of one replica cell 42 shown in FIG. 8 of the first embodiment, two replica cells 42A and 42B connected in series are used. Each of the two replica cells 42A and 42B is formed of a variable resistance element and a select transistor connected in series. The variable resistance element included in each of the replica cells 42A and 42B is fixed to a resistance Rmax of a memory cell MC in a high-resistance state.

The replica cells 43 and 44 have a configuration similar to that of the replica cell 41. The replica cells 43 and 44 may be fixed to a resistance Rmax of a memory cell MC in a high-resistance state. The number of replica cells forming each of the replica cells 41 to 44 may be more than two.

In the voltage generation circuit 15 with the above-described configuration, a reference voltage VR and a reference current Iref are calculated by the relations the same as those described in the first embodiment. Accordingly, the reference current Iref is set to an intermediate current between a cell current flowing through a "0" memory cell to which a reading voltage VM is applied, and a cell current flowing through a "1" memory cell to which a reading voltage VM is applied.

Further, the reading voltage VM is calculated by the following equation:

$$VM = 4 \times Ibias \times Rmin \times Rmax / (Rmin + Rmax)$$

As described above, according to the fourth embodiment, the voltage applied to each of the replica cells forming the voltage generation circuit 15 can be reduced, as compared to the first embodiment. This prevents the voltage generation circuit 15 from being easily damaged and eventually increases life of the voltage generation circuit 15.

Further, by forming each of the replica cells 41 to 44, which is formed of one replica cell in the first embodiment, of a plurality of replica cells, variation among the replica cells 41 to 44 can be reduced. Thereby, variation in reading voltage VM and reference voltage VR generated by the voltage generation circuit 15 can be reduced. The other effects are the same as those of the first embodiment.

The voltage generation circuit 15 described in the fourth embodiment can also be applied to the second embodiment.

Fifth Embodiment

In a fifth embodiment, which is a modification example of the first embodiment, each of four replica cells 41 to 44 used in a voltage generation circuit 15 is formed of a plurality of replica cells connected in parallel.

Figure 20:
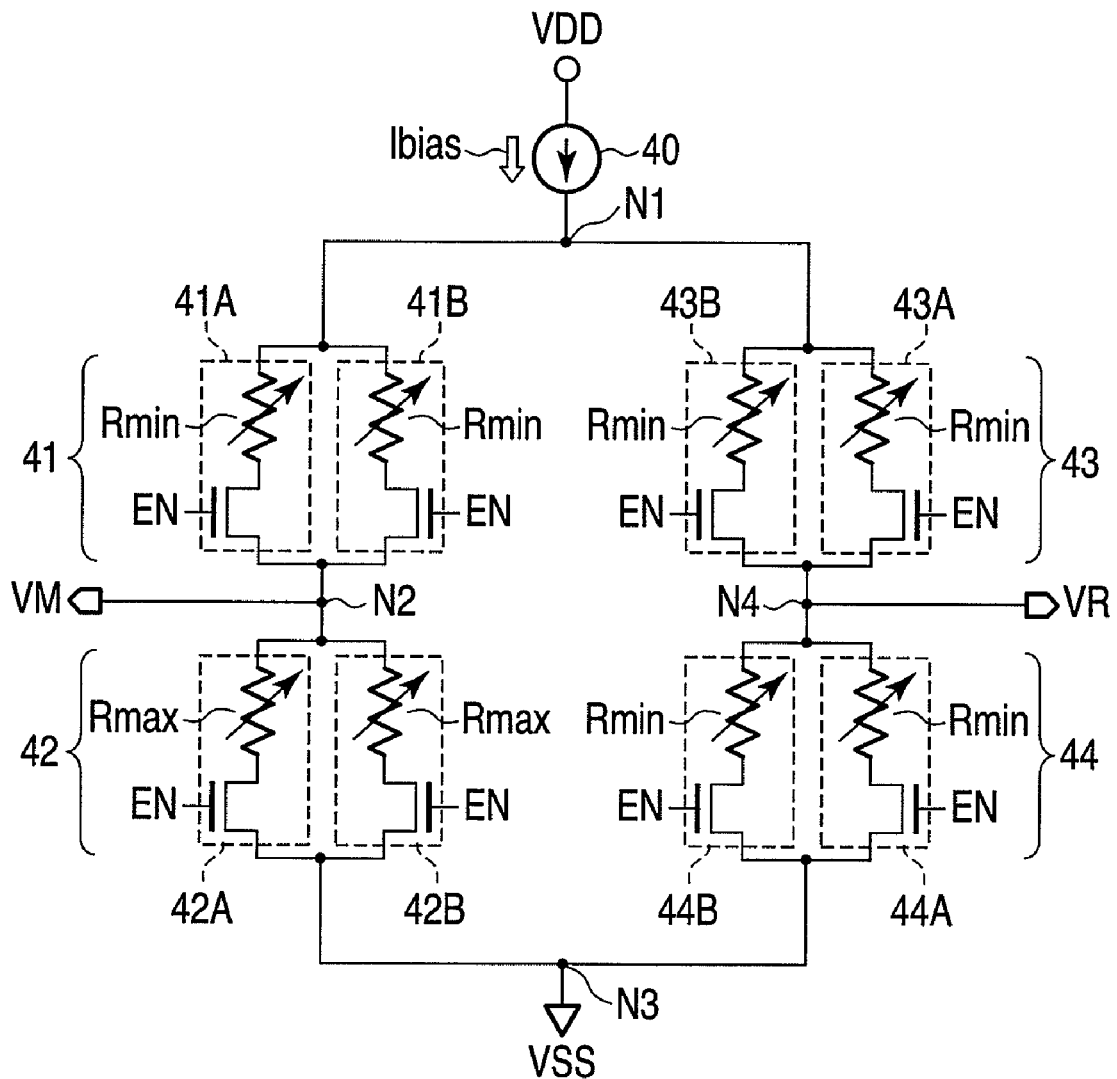
FIG. 20 is a circuit diagram illustrating a configuration of a voltage generation circuit 15 according to a fifth embodiment of the present invention.

FIG. 20 is a circuit diagram illustrating a configuration of the voltage generation circuit 15 according to the fifth embodiment of the present invention. In the fifth embodiment, the replica cell 41 shown in FIG. 8 of the first embodiment is formed of two replica cells 41A and 41B connected in parallel.

Each of the two replica cells 41A and 41B is formed of a variable resistance element and a select transistor connected in series. The variable resistance element included in each of the replica cells 41A and 41B is fixed to a resistance the same as that of the reference cell RC, that is, a resistance Rmin of a memory cell MC in a low-resistance state.

Similarly, in FIG. 20, the replica cell 42 shown in FIG. 8 of the first embodiment is formed of two replica cells 42A and 42B connected in parallel.

Each of the two replica cells 42A and 42B is formed of a variable resistor element and a select transistor connected in series. The variable resistance element included in each of the replica cells 42A and 42B is fixed to a resistance Rmax of a memory cell MC in a high-resistance state.

The replica cells 43 and 44 have a configuration similar to that of the replica cell 41. The replica cells 43 and 44 may be fixed to a resistance Rmax of a memory cell MC in a high-resistance state. The number of replica cells forming each of the replica cells 41 to 44 may be more than two.

In the voltage generation circuit 15 with the above-described configuration, a reference voltage VR and a reference current Iref are calculated by relations the same as the relations shown in the first embodiment. Accordingly, the reference current Iref is set to an intermediate current between a cell current flowing through a "0" memory cell to which a reading voltage VM is applied and a cell current flowing through a "1" memory cell to which a reading voltage VM is applied.

The reading voltage VM is calculated by the following equation:

$$VM = Ibias \times Rmin \times Rmax / (Rmin + Rmax)$$

As described above, according to the fifth embodiment, variation among the replica cells 41 to 44 can be reduced. Thereby, variation in reading voltage VM and reference voltage VR generated by the voltage generation circuit 15 can be reduced. The other effects are the same as those of the first embodiment.

The voltage generation circuit 15 shown in the fifth embodiment can also be applied to the second embodiment.

[Example]

As described above, various memories other than an MRAM can be used as the variable resistance memory of the present embodiment. Hereinafter, as another example of the variable resistance memory, an ReRAM and a PRAM will be described.

(Re RAM)

FIG. 21 is a schematic diagram illustrating a configuration of a variable resistance element 20 used in an ReRAM. The variable resistance element 20 includes a lower electrode 22, an upper electrode 26, and a record layer 70 interposed therebetween.

The record layer 70 is formed of a transition metal oxide such as a perovskite metal oxide or a binary metal oxide. Examples of the perovskite metal oxide include PCMO ($Pr_{0.7}Ca_{0.3}MnO_3$), Nb-doped SrTi (Zr) $O_3$, and Cr-doped SrTi (Zr) $O_3$, for example. Examples of the binary metal oxide include NiO, $TiO_2$ and $Cu_2O$, for example.

The variable resistance element 20 varies in resistance by varying the polarity of the voltage applied thereto (bipolar type), or varies in resistance by varying an absolute value of the voltage applied thereto (unipolar type). Accordingly, the variable resistance element 20 is set to a low-resistance state or a high-resistance state by controlling the application voltage. Whether the type is bipolar or unipolar is determined based on the material of the selected record layer 70.

In the case of a variable resistance element 20 of the bipolar type, for example, where the voltage at which the variable resistance element 20 is switched from a high-resistance state (reset state) to a low-resistance state (set state) is a set voltage Vset, and the voltage at which the variable resistance element 20 is switched from a low-resistance state (set state) to a high-resistance state (reset state) is a reset voltage Vreset, the set voltage Vset is set to a positive bias which applies a positive voltage to the upper electrode 26 with respect to the lower electrode 22, and the reset voltage Vreset is set to a negative bias which applies a negative voltage to the upper electrode 26 with respect to the lower electrode 22. Further, by associating the low-resistance state and the high-resistance state with "0" data and "1" data, respectively, the variable resistance element 20 can store 1-bit data.

When data is read, a sufficiently small reading voltage, which is approximately $\frac{1}{1000}$ to $\frac{1}{4}$ of the reset voltage Vreset, is applied to the variable resistance element 20. At this time, data can be read by detecting a current flowing through the variable resistance element 20.

(PRAM)

FIG. 22 is a schematic diagram illustrating a configuration of a variable resistance element 20 used in a PRAM. The variable resistance element 20 is formed of a lower electrode 22, a heater layer 71, a record layer 72, and an upper electrode 26, which are sequentially stacked.

The record layer 72 is formed of a phase-change material, and is set in a crystalline state or an amorphous state by the heat generated during writing. Example materials for the record layer 72 include chalcogen compounds such as Ge—Sb—Te, In—Sb—Te, Ag—In—Sb—Te, and Ge—Sn—Te. These materials are desirable for securing high-speed switching, repetition record stability, and high reliability.

The heater layer 71 contacts a bottom surface of the record layer 72. It is desirable that the area contacting the record layer 72 of the heater layer 71 is smaller than the area of the bottom surface of record layer 72. This is to reduce the area of the heating part by reducing the area of the contact part of the heater layer 71 and the record layer 72, thereby reducing the write current or voltage. The heater layer 71 is formed of a conductive material, and desirably formed of a material selected from TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSi, Ti, Ti—W, and Cu. The heater layer 71 may be formed of a material the same as that of the lower electrode 22, which will be described later.

The area of the lower electrode 22 is larger than the area of the heater layer 71. The upper electrode 26 has a planar shape the same as that of the record layer 72, for example. Materials for the lower electrode 22 and the upper electrode 26 include high-melting metals such as Ta, Mo and W. The record layer 72, in which a heating temperature varies by controlling a size and a width of a current pulse applied thereto, changes into a crystalline state or amorphous state. More specifically, at the time of writing, a voltage or current is applied between the lower electrode 22 and the upper electrode 26, and a current flows to the lower electrode 22 through the record layer 72 and the heater layer 71 from the upper electrode 26. When the record layer 72 is heated to a temperature close to a melting point, the record layer 72 changes to an amorphous phase (high-resistance phase), and maintains the amorphous phase even if the application of the voltage or the current is stopped.

On the other hand, when a voltage or current is applied between the lower electrode 22 and the upper electrode 26, and the record layer 72 is heated to a temperature suitable for crystallization, the record layer 72 changes to a crystalline (low-resistance) phase, and maintains the crystalline phase even when application of the voltage or the current is stopped. When the record layer 72 is changed to a crystalline state, the size of the current pulse applied to the record layer 72 is set smaller, and the width of the current pulse is set greater, as compared to the case of changing to an amorphous state. By thus heating the record layer 72 by applying a voltage or a current between the lower electrode 22 and the upper electrode 26, the resistance of the record layer 72 can be varied.

Whether the record layer 72 is in a crystalline phase or in an amorphous phase can be determined by applying a low voltage or a low current of a degree which does not cause crystallization or noncrystallization in the record layer 72 between the lower electrode 22 and the upper electrode 26 and reading the voltage or current between the lower electrode 22 and the upper electrode 26. Therefore, by associating a low-resistance state and a high-resistance state with "0" data and "1" data, 1-bit data can be read from the variable resistance element 20.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell comprising a first resistance state and a second resistance state based on stored data;
a bit line connected to the memory cell;
a reference cell configured to generate a reference current used to determine the stored data of the memory cell and fixed to the first resistance state;
a reference bit line connected to the reference cell; and
a generation circuit configured to generate a reading voltage applied to the memory cell and a reference voltage applied to the reference cell,
wherein the generation circuit comprises:
a constant current source connected to a first node;
a first replica cell connected between the first node and a second node and fixed to the first resistance state;
a second replica cell connected between the second node and a third node and fixed to the second resistance state;
a first resistance element connected between the first node and a fourth node; and
a second resistance element connected between the fourth node and the third node and comprising a resistance substantially the same as a resistance of the first resistance element,
the reading voltage is output from the second node, and
the reference voltage is output from the fourth node.

2. The device of claim 1, further comprising an adjustment circuit configured to set the bit line to the reading voltage and to set the reference bit line to the reference voltage,
wherein the adjustment circuit comprises:
a first Metal-Oxide-Semiconductor Field-Effect Transistor (MOSFET) comprising a source connected to the bit line;
a first operational amplifier comprising a non-inverting input terminal to which the reading voltage is applied from the generation circuit, an inverting input terminal connected to the bit line, and an output terminal connected to a gate of the first MOSFET;
a second MOSFET comprising a source connected to the reference bit line; and
a second operational amplifier comprising a non-inverting input terminal to which the reference voltage is applied from the generation circuit, an inverting input terminal connected to the reference bit line, and an output terminal connected to a gate of the second MOSFET.

3. The device of claim 1, further comprising:
a first MOSFET comprising a source connected to the bit line, a gate to which a first control voltage is applied, and configured to set the bit line to the reading voltage based on the first control voltage;
a second MOSFET comprising a source connected to the reference bit line, a gate to which a second control voltage is applied, and configured to set the reference bit line to the reference voltage based on the second control voltage; and
a transfer circuit configured to supply the first control voltage to the gate of the first MOSFET and to supply the second control voltage to the gate of the second MOSFET,
wherein the transfer circuit comprises:
a third MOSFET comprising a source connected to a third replica cell;
a first operational amplifier comprising a non-inverting input terminal to which the reading voltage is applied from the generation circuit, an inverting input terminal connected to the source of the third MOSFET, and an output terminal connected to a gate of the third MOSFET;
a fourth MOSFET comprising a source connected to a fourth replica cell;
a second operational amplifier comprising a non-inverting input terminal to which the reference voltage is applied from the generation circuit, an inverting input terminal connected to the source of the fourth MOSFET, and an output terminal connected to a gate of the fourth MOSFET,
the first control voltage is output from the output terminal of the first operational amplifier, and
the second control voltage is output from the output terminal of the second operational amplifier.

4. The device of claim 3, wherein the third replica cell and the fourth replica cell are fixed to either the first resistance state or the second resistance state.

5. The device of claim 1, wherein the first replica cell and the second replica cell comprise a plurality of replica cells connected in series.

6. The device of claim 1, wherein the first replica cell and the second replica cell comprise a plurality of replica cells connected in parallel.

7. The device of claim 1, further comprising a sense amplifier comprising a first input terminal connected to the bit line and a second input terminal connected to the reference bit line, and configured to detect the stored data of the memory cell based on the reference current.

8. The device of claim 1, wherein the reference current is an intermediate current between a first cell current flowing through a memory cell in the first resistance state and a second cell current flowing through a memory cell in the second resistance state.

9. The device of claim 1, wherein the memory cell comprises a variable resistance element and a select transistor connected in series.

10. The device of claim 9, wherein the variable resistance element is a magnetoresistive element.

11. A semiconductor memory device comprising:
a memory cell comprising a first resistance state and a second resistance state based on stored data;
a bit line connected to the memory cell;
a reference cell configured to generate a reference current used to determine the stored data of the memory cell and fixed to the first resistance state;
a reference bit line connected to the reference cell; and
a generation circuit configured to generate a reading voltage applied to the memory cell and a reference voltage applied to the reference cell,
wherein the generation circuit comprises:
a constant current source connected to a first node;
a first replica cell connected between the first node and a second node and fixed to the first resistance state;
a second replica cell connected between the second node and a third node and fixed to the second resistance state;
a third replica cell connected between the first node and a fourth node and fixed to one of the first resistance state and the second resistance state; and
a fourth replica cell connected between the fourth node and the third node and comprising a resistance substantially the same as a resistance of the third replica cell,
the reading voltage is output from the second node, and
the reference voltage is output from the fourth node.

12. The device of claim 11, further comprising an adjustment circuit configured to set the bit line to the reading voltage and to set the reference bit line to the reference voltage,
wherein the adjustment circuit comprises:
a first MOSFET comprising a source connected to the bit line;
a first operational amplifier comprising a non-inverting input terminal to which the reading voltage is applied from the generation circuit, an inverting input terminal connected to the bit line, and an output terminal connected to a gate of the first MOSFET;
a second MOSFET comprising a source connected to the reference bit line; and
a second operational amplifier comprising a non-inverting input terminal to which the reference voltage is applied from the generation circuit, an inverting input terminal connected to the reference bit line, and an output terminal connected to a gate of the second MOSFET.

13. The device of claim 11, further comprising:
a first MOSFET comprising a source connected to the bit line, a gate to which a first control voltage is applied, and configured to set the bit line to the reading voltage based on the first control voltage;
a second MOSFET comprising a source connected to the reference bit line, a gate to which a second control voltage is applied, and configured to set the reference bit line to the reference voltage based on the second control voltage; and
a transfer circuit configured to supply the first control voltage to the gate of the first MOSFET and to supply the second control voltage to the gate of the second MOSFET,
wherein the transfer circuit comprises:
a third MOSFET comprising a source connected to a fifth replica cell;
a first operational amplifier comprising a non-inverting input terminal to which the reading voltage is applied from the generation circuit, an inverting input terminal connected to the source of the third MOSFET, and an output terminal connected to a gate of the third MOSFET;

a fourth MOSFET comprising a source connected to a sixth replica cell;

a second operational amplifier comprising a non-inverting input terminal to which the reference voltage is applied from the generation circuit, an inverting input terminal connected to the source of the fourth MOSFET, and an output terminal connected to a gate of the fourth MOSFET, the first control voltage is output from the output terminal of the first operational amplifier, and the second control voltage is output from the output terminal of the second operational amplifier.

14. The device of claim 13, wherein the fifth replica cell and the sixth replica cell are fixed to either the first resistance state or the second resistance state.

15. The device of claim 11, wherein the first to fourth replica cells comprise a plurality of replica cells connected in series.

16. The device of claim 11, wherein the first to fourth replica cells comprise a plurality of replica cells connected in parallel.

17. The device of claim 11, further comprising a sense amplifier comprising a first input terminal connected to the bit line and a second input terminal connected to the reference bit line, and configured to detect the stored data of the memory cell based on the reference current.

18. The device of claim 11, wherein the reference current is an intermediate current between a first cell current flowing through a memory cell in the first resistance state and a second cell current flowing through a memory cell in the second resistance state.

19. The device of claim 11, wherein the memory cell comprises a variable resistance element and a select transistor connected in series.

20. The device of claim 19, wherein the variable resistance element is a magnetoresistive element.

* * * * *